US012693365B2

(12) United States Patent
Dosenbach et al.

(10) Patent No.: US 12,693,365 B2
(45) Date of Patent: Jul. 28, 2026

(54) FRAMEWISE MULTI-ECHO DISTORTION CORRECTION FOR SUPERIOR MRI

(71) Applicants: Washington University, St. Louis, MO (US); The Trustees of the University of Pennsylvania, Philadelphia, PA (US); Regents of the University of Minnesota, Minneapolis, MN (US)

(72) Inventors: Nico Dosenbach, St. Louis, MO (US); Andrew Van, St. Louis, MO (US); Vahdeta Suljic, St. Louis, MO (US); M. Dylan Tisdall, Philadelphia, PA (US); Damien Fair, Minneapolis, MN (US); David Montez, St. Louis, MO (US)

(73) Assignees: Washington University, St. Louis, MO (US); Trustees of the University of Pennsylvania, Philadelphia, PA (US); Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 18/936,342

(22) Filed: Nov. 4, 2024

(65) Prior Publication Data

US 2025/0147138 A1 May 8, 2025

Related U.S. Application Data

(60) Provisional application No. 63/595,566, filed on Nov. 2, 2023.

(51) Int. Cl.
*G01R 33/565* (2006.01)

(52) U.S. Cl.
CPC .................................. *G01R 33/565* (2013.01)

(58) Field of Classification Search
CPC .............. G01R 33/565; G01R 33/4806; G01R 33/56563; G01R 33/243
See application file for complete search history.

(56) References Cited

U.S. PATENT DOCUMENTS

| | | | | |
|---|---|---|---|---|
| 10,675,002 | B2 * | 6/2020 | Mahmoud | A61B 8/485 |
| 2009/0091322 | A1 * | 4/2009 | Posse | G01R 33/5611 |
| | | | | 324/307 |
| 2014/0099012 | A1 * | 4/2014 | Begin | G06T 5/80 |
| | | | | 382/131 |
| 2015/0285877 | A1 * | 10/2015 | Pfeuffer | G01R 33/56563 |
| | | | | 324/309 |

(Continued)

*Primary Examiner* — Baisakhi Roy
(74) *Attorney, Agent, or Firm* — Armstrong Teasdale LLP

(57) ABSTRACT

A computer system and method for providing functional magnetic resonance imaging (MRI) distortion correction. A processor of the computer system is caused to: receive multi-echo functional MRI (ME-fMRI) data obtained from a magnetic resonance acquisition; measure a difference between two or more echoes of a plurality of echoes associated with the at least one magnetic resonance acquisition; sample distortion across a plurality of image frames included in the ME-fMRI data; estimate a frame-by-frame magnetic field inhomogeneity for each of the plurality of image frames; perform dynamic frame-wise distortion correction for each of the plurality of image frames to generate corrected data; and generate one or more field maps based on the corrected data.

20 Claims, 22 Drawing Sheets
(15 of 22 Drawing Sheet(s) Filed in Color)

100

(56) References Cited

U.S. PATENT DOCUMENTS

| | | | |
|---|---|---|---|
| 2015/0362575 A1* | 12/2015 | Ourselin | G06T 5/70 |
| | | | 382/131 |
| 2019/0369185 A1* | 12/2019 | Setsompop | G01R 33/4818 |
| 2020/0049782 A1* | 2/2020 | Brender | G06T 5/50 |
| 2022/0057467 A1* | 2/2022 | Valvano | G01R 33/56554 |
| 2023/0380714 A1* | 11/2023 | Dou | A61B 5/055 |

* cited by examiner

320

| Task | rx (deg) | ry (deg) | rz (deg) | tx (mm) | ty (mm) | tz (mm) |
|---|---|---|---|---|---|---|
| Neutral | -0.09 (0.04) | -0.15 (0.08) | -0.08 (0.09) | -0.17 (0.13) | -0.06 (0.04) | 0.02 (0.07) |
| Rotate +z | -1.54 (0.10) | -1.47 (0.05) | 14.96 (0.08) | -2.26 (0.23) | -0.69 (0.04) | -2.94 (0.31) |
| Rotate -z | 0.99 (0.07) | -1.90 (0.08) | -9.78 (0.05) | -3.84 (0.05) | -0.26 (0.04) | -1.52 (0.09) |
| Rotate +x | 10.64 (0.27) | -2.510 (0.13) | 0.85 (0.07) | -0.98 (0.10) | 4.93 (0.18) | 3.78 (0.17) |
| Rotate -x | -13.73 (0.24) | -2.799 (0.07) | -0.94 (0.16) | -2.45 (0.25) | -4.22 (0.07) | 0.71 (0.14) |
| Rotate +y | -1.38 (0.05) | -10.79 (0.06) | 21.44 (0.06) | 2.72 (0.08) | -2.15 (0.04) | -5.35 (0.15) |
| Rotate -y | 0.09 (0.09) | 8.58 (0.22) | -18.85 (0.12) | -5.79 (0.13) | -1.21 (0.04) | -3.31 (0.07) |

700

| Metric | MEDIC | TOPUP | t-statistic | p-value | df |
|---|---|---|---|---|---|
| T1w $R^2$ Spotlight | 0.068 (0.007) | 0.066 (0.008) | 7.133 | <0.001 | 184 |
| T2w $R^2$ Spotlight | 0.083 (0.010) | 0.081 (0.011) | 6.124 | <0.001 | 184 |
| T1w $R^2$ | 0.083 (0.028) | 0.080 (0.028) | 11.284 | <0.001 | 184 |
| T2w $R^2$ | 0.457 (0.053) | 0.454 (0.050) | 2.729 | 0.007 | 184 |
| T1w Grad. Correlation | 0.43 (0.028) | 0.414 (0.036) | 11.727 | <0.001 | 184 |
| T2w Grad. Correlation | 0.637 (0.04) | 0.638 (0.054) | -0.371 | 0.711 | 184 |
| T1w NMI | 0.872 (0.029) | 0.872 (0.029) | -0.106 | 0.915 | 184 |
| T2w NMI | 0.836 (0.026) | 0.838 (0.026) | -1.985 | 0.049 | 184 |
| Gray/White Matter AUC | 0.692 (0.031) | 0.686 (0.036) | 6.598 | <0.001 | 184 |
| Brain/Exterior AUC | 0.735 (0.035) | 0.729 (0.034) | 11.488 | <0.001 | 184 |
| Ventricles/White Matter AUC | 0.829 (0.057) | 0.829 (0.062) | -0.058 | 0.954 | 184 |
| Cerebellum/Exterior AUC | 0.807 (0.041) | 0.806 (0.049) | 5.073 | <0.001 | 184 |

750

TOPUP field map for High motion data

1000

| RECEIVE MRI DATA | 1002 |

↓

| MEASURE DIFFERENCE IN THE MRI DATA | 1004 |

↓

| SAMPLE DISTORTION IN THE MRI DATA | 1006 |

↓

| ESTIMATE MAGNETIC FIELD INHOMOGENEITY IN THE MRI DATA | 1008 |

↓

| PERFORM DYNAMIC FRAME-WISE DISTORTION CORRECTION ON THE MRI DATA | 1010 |

↓

| GENERATE CORRECTED DATA | 1012 |

↓

| GENERATE FIELD MAPS BASED ON THE CORRECTED DATA | 1014 |

1

FRAMEWISE MULTI-ECHO DISTORTION CORRECTION FOR SUPERIOR MRI

CROSS-REFERENCE TO RELATED APPLICATIONS

This application claims priority to U.S. provisional application No. 63/595,566 filed on Nov. 2, 2023, the entire content and disclosures of which is/are incorporated herein by reference in their entireties.

STATEMENT REGARDING FEDERALLY SPONSORED RESEARCH & DEVELOPMENT

This invention was made with government support under MH096773 awarded by the National Institutes of Health. The government has certain rights in the invention.

FIELD

The field of this disclosure relates generally to magnetic resonance imaging (MRI), and more specifically to correcting distortions in functional MRI data.

BACKGROUND

Functional MRI is a noninvasive brain scan that shows which parts of the brain are active when a person performs certain tasks. Echo planar imaging (EPI) is a vital technique for fast sampling in magnetic resonance (MR) acquisition, driving imaging modalities such as blood-oxygen level dependent (BOLD) imaging and diffusion weighted imaging (DWI). However, EPI is highly susceptible to off-resonance effects in the main (B0) magnetic field. These lead to local image distortion which prevent accurate localization of anatomical structures.

Functional MRI (fMRI) data acquired using echo planar imaging (EPI) sequences are prone to local image distortions due to magnetic field inhomogeneities (B0) arising from differences in magnetic susceptibility, particularly across air-tissue interfaces. The orbitofrontal and inferior temporal cortices suffer the largest distortion due to their proximity to the sinuses, mastoids, and ear canals, but distortion is present to varying degrees across the brain. The presence of local image distortion is particularly problematic for functional connectivity (FC) and task fMRI analyses, which rely on accurate co-registration of functional and anatomical data. Image distortion degrades the performance of registration algorithms used to align functional data to anatomical data and prevents accurate spatial localization of anatomical features in fMRI studies.

Functional MRI (fMRI) data are severely distorted by magnetic field (B0) inhomogeneities which currently must be corrected using separately acquired field map data. However, changes in the head position of a scanning participant across fMRI frames can cause changes in the B0 field, preventing accurate correction of geometric distortions. Additionally, field maps can be corrupted by movement during their acquisition, preventing distortion correction altogether. To correct geometric distortions in fMRI data, dedicated field map scans are acquired before fMRI acquisitions to estimate the B0 field inhomogeneity. However, such static distortion correction approaches are vulnerable to head motion and represent only a snapshot of the field inhomogeneities. Head movement during fMRI is notorious for introducing significant noise and systematic artifacts into the data. In the context of susceptibility artifact correction, head position and motion will compromise the accuracy of the field map data, rendering distortion corrections inaccurate. Distortion corrections estimated from separately-collected field maps are accurate only so long as the participant's head remains in the same position they were in when the field map was collected. This is because rotations about axes orthogonal to the main magnetic field (e.g., through-plane rotations, when slices are defined axially) change the susceptibility induced inhomogeneities in the B0 magnetic field and thus the degree of distortion in the fMRI data. Thus, a distortion correction method that is robust to head motion and position would greatly benefit fMRI, particularly where motion may be related to phenomena of interest.

At least some current methods correct image distortion through collection of a static field map scan, prior to EPI data collection to correct for image distortion post data acquisition. However, head motion and additional off-resonance effects can turn a static field map scan invalid, since the off-resonance for the EPI data can be different compared to when the field map reference was acquired. These time varying changes reduce the efficacy of current field map correction techniques.

What is needed is a system and method to (i) dynamically sample distortion due to fluctuating B0 field inhomogeneity across frames, (ii) accurately estimate distortions for each frame of multi-echo fMRI data, and (iii) correcting susceptibility distortions in fMRI data.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION OF THE DISCLOSURE

One aspect of the present disclosure is a computer system for providing functional magnetic resonance imaging (MRI) distortion correction, the computer system including at least one processor in communication with at least one memory device, the at least one processor programmed to: receive multi-echo functional MRI (ME-fMRI) data obtained from one or more MRI scanners configured to perform at least one magnetic resonance acquisition, the ME-fMRI data including phase information and time information associated with the at least one magnetic resonance acquisition; measure at least one difference between two or more echoes of a plurality of echoes associated with the at least one magnetic resonance acquisition; sample distortion across a plurality of image frames included in the ME-fMRI data, the distortion being a result of fluctuating magnetic field inhomogeneities associated with the two or more echoes; estimate, based on the sampled distortion, a frame-by-frame magnetic field inhomogeneity for each of the plurality of image frames; based on each estimated frame-by-frame magnetic field inhomogeneity, perform dynamic frame-wise distortion correction for each of the plurality of image frames to generate corrected data; and generate one or more field maps based on the corrected data.

Another aspect of the present disclosure is a computer-implemented method for providing functional magnetic resonance imaging (MRI) distortion correction using at least one processor in communication with at least one memory, the method including: receiving multi-echo functional MRI (ME-fMRI) data obtained from one or more MRI scanners configured to perform at least one magnetic resonance acquisition, the ME-fMRI data including phase information and time information associated with the at least one magnetic resonance acquisition; measuring at least one difference between two or more echoes of a plurality of echoes associated with the at least one magnetic resonance acquisition; sampling distortion across a plurality of image frames included in the ME-fMRI data, the distortion being a result of fluctuating magnetic field inhomogeneities associated with the two or more echoes; estimating, based on the sampled distortion, a frame-by-frame magnetic field inhomogeneity for each of the plurality of image frames; based on each estimated frame-by-frame magnetic field inhomogeneity, performing dynamic frame-wise distortion correction for each of the plurality of image frames to generate corrected data; and generating one or more field maps based on the corrected data.

Yet another aspect of the present disclosure is one or more non-transitory computer-readable storage media for a computing system providing functional magnetic resonance imaging (MRI) distortion correction, the one or more non-transitory computer-readable storage media comprising a plurality of instructions stored thereon that, in response to being executed, cause the computing system to: receive multi-echo functional MRI (ME-fMRI) data obtained from one or more MRI scanners configured to perform at least one magnetic resonance acquisition, the ME-fMRI data including phase information and time information associated with the at least one magnetic resonance acquisition; measure at least one difference between two or more echoes of a plurality of echoes associated with the at least one magnetic resonance acquisition; sample distortion across a plurality of image frames included in the ME-fMRI data, the distortion being a result of fluctuating magnetic field inhomogeneities associated with the two or more echoes; estimate, based on the sampled distortion, a frame-by-frame magnetic field inhomogeneity for each of the plurality of image frames; based on each estimated frame-by-frame magnetic field inhomogeneity, perform dynamic frame-wise distortion correction for each of the plurality of image frames to generate corrected data; and generate one or more field maps based on the corrected data.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The embodiments described herein may be better understood by referring to the following description in conjunction with the accompanying drawings.

Corresponding reference characters indicate corresponding parts throughout the drawings.

DETAILED DESCRIPTION

Figure 1A:
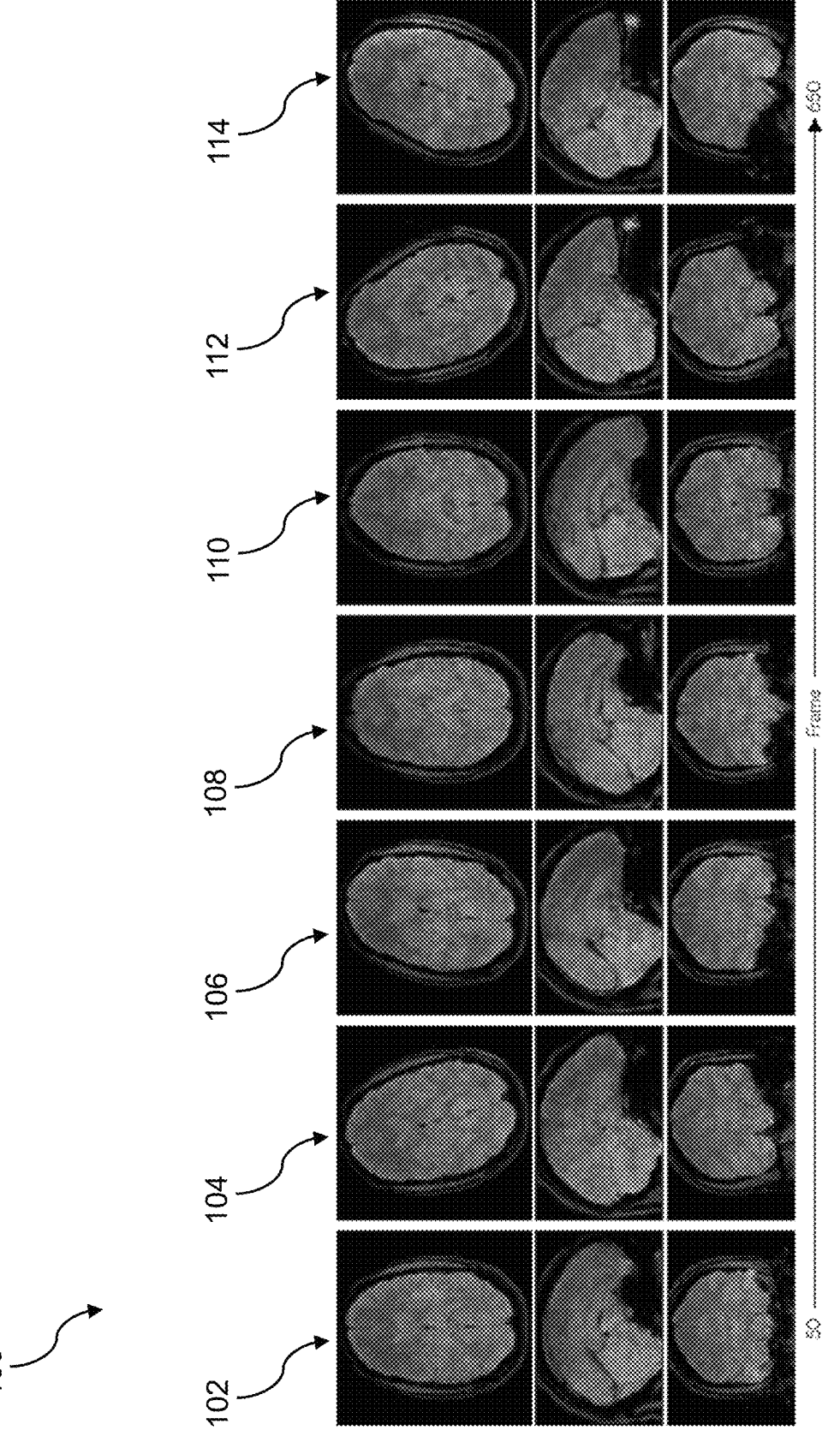
FIG. 1A is a diagram illustrating images from a fMRI time series as a participant rotated their head about an axis.

The following detailed description illustrates embodiments of the present disclosure by way of example and not by way of limitation. The description enables one skilled in the art to make and use the disclosure, describes several embodiments, adaptations, variations, alternatives, and uses of the disclosure, including what is presently believed to be the best mode of carrying out the disclosure. The disclosure is described as applied to an example embodiment, namely, methods and systems for (i) dynamically sampling distortion due to fluctuating B0 field inhomogeneity across frames, (ii) accurately estimating distortions for each frame of multi-echo fMRI data, and (iii) correcting susceptibility distortions in fMRI data.

Multi-echo fMRI (ME-fMRI) refers to collecting data at multiple echo times, resulting in multiple volumes with varying levels of contrast acquired per RF pulse to functional MRI. ME-fMRI has been shown to have several advantages for BOLD signal detection relative to single-echo sequences. By combining data across echoes, ME-fMRI increases BOLD signal sensitivity, particularly to regions that have significant signal dropout at typical single-echo times. Further, multiple echo times allow modeling and separation of neurobiologically relevant fMRI signals from physiological and physics-related artifacts. These features of ME-fMRI have been shown to improve reliability of resting-state functional connectivity (RSFC) estimation, especially in clinically relevant sub-cortical brain regions like the subgenual cingulate, basal ganglia, and cerebellum. The improved reliability is attributed to greater signal-to-noise ratio (SNR), enabling more rapid and precise mapping of the brain.

Functional MRI data are complex signals composed of magnitude and phase components, where magnitude images at each repetition time (TR) are typically used to evaluate temporal changes in BOLD contrast via T2. However, ME-fMRI phase data from each TR provides spatial and temporal information about magnetic field variations. By measuring the difference in phase between echoes in ME-fMRI data, magnetic field inhomogeneity such as B0 field inhomogeneity can be estimated as the slope of the linear relationship between phase and echo time. Since phase information can be acquired at every TR, a frame-by-frame measure of the B0 field inhomogeneity can be estimated, allowing for more accurate, motion-robust, frame-wise correction of susceptibility distortion in ME-fMRI data. Frame-wise distortion correction in ME-fMRI also eliminates the need for separate field map acquisitions, which are required for static distortion correction. Capitalizing on the recent surge in ME-fMRI usage, an easy-to-use, precise method for dynamic, frame-wise distortion correction was built. Described herein is a high-speed Multi-Echo DIstortion Correction (MEDIC) algorithm for correcting susceptibility distortions in fMRI data. Comparisons of MEDIC against a current gold standard method, which uses a single static B0 estimation and correction (TOPUP), demonstrate its superiority, especially in the presence of head motion. The MEDIC algorithm may be provided in a parallel algorithm configuration in some embodiments, for example to enable multiple parts of the workload to be performed concurrently to reduce the time to solution and increase performance.

In fMRI studies, distortion of the source images is transmitted downstream, distorting all derived research findings and clinical maps. Previously state-of-the-art methods employed static distortion correction techniques that depend on the acquisition of a separate field map image. However, as described herein, static field mapping is limiting and becomes less accurate with larger head displacements during a scan. Given the massive challenge of head motion, especially in children, the elderly, and patient populations, motion robust distortion correction is crucial for the success of fMRI studies in these subpopulations.

Despite the conceptual superiority of dynamic field mapping approaches, prior attempts have not been widely adopted by the neuroimaging community. This is largely due to the lack of availability of multi-echo sequences, difficulty in implementation, and widely available open-source releases of said approaches. With the recent growing interest and use of ME-fMRI for neuroimaging studies, the MEDIC method described herein provides researchers the capability to address dynamic magnetic field (e.g., B0) changes due to head motion. MEDIC may be provided as a freely available open source tool, and may further motivate the use of ME-fMRI in the neuroimaging field. Various benefits of ME-fMRI and/or MEDIC are described below in items (1) through (6).

(1) ME-fMRI enhances sensitivity, reliability, and signal coverage in neuroimaging. ME-fMRI has many established benefits over single-echo fMRI (SE-fMRI). ME-fMRI allows for multiple echoes to be analyzed separately or as an optimally combined time series, which exhibits higher SNR and improves statistical power of analyses in regions of high susceptibility. Multiple echoes also allow for additional denoising capabilities through ME-ICA or denoising pipelines, such as tedana. Recent neuroimaging breakthroughs, such as the discovery of the somato-cognitive action network (SCAN), in the central sulcus, which was previously thought to be the exclusive domain of effector-specific primary motor cortex, utilized ME-fMRI data. ME-fMRI was also used to discover that the ventromedial prefrontal cortex (vmPFC), a region plagued by massive distortions, includes an enlarged salience network node in depression patients. Similarly, ME-fMRI was able to identify individual-specific persistent brain changes after a single dose of the psychedelic psilocybin. Patient-(clinical) and individual-specific (research) precision functional mapping (PFM) are specific applications of RSFC and task fMRI where ME-fMRI and by extension MEDIC are most valuable. Averaging fMRI data across individuals blurs spatial boundaries, effectively smoothing the underlying data. Therefore, group-averaging partially obscures the greater spatial precision obtainable with ME-fMRI and MEDIC. Hence, it may not be a coincidence that several strong proponents of ME-fMRI have been using it for PFM, through which greater confidence in spatial details can be directly converted into neuroscientific insights. If the goal is individual-specific PFM, then ME-fMRI and MEDIC improve SNR and distortion correction, with the minor cost of slightly longer data processing times and increase in TR. Furthermore, with MEDIC, field map scans can be eliminated from the scanning protocol, eliminating the risk that some field maps end up motion corrupted or lost altogether.

(2) MEDIC further boosts the capabilities of ME-fMRI through dynamic field map correction. Head motion also impacts distortions by changing the spatial distribution of the B0 field inhomogeneity. Changes to the B0 magnetic field result when someone rotates their head out of the slice plane (e.g., readout and phase encoding directions). Traditional static field maps cannot account for these time-varying changes to the field, since they only measure the B0 field at a single time point before or after a scan. In addition, any head motion that occurs between the field map acquisition and the fMRI scan will also reduce the accuracy of distortion correction due to localization errors. Computing the phase evolution across multiple echo times across a ME-fMRI sequence allows one to compute a field map for each data frame, allowing for the tracking of magnetic field (B0) inhomogeneities dynamically and as close to real-time as possible. With MEDIC, this results in two main benefits. First, this allows MEDIC to measure the B0 field at each TR, allowing for the measurement of any time-varying changes to the field. Second, since MEDIC field maps are inherently co-registered to the ME-fMRI data it is correcting, and eliminating any errors in co-registration that may arise from separate field map acquisitions. As a general observation, for every 1 degree of head rotation outside of the slice plane, a maximum change in the B0 field of 5 Hz/0.3 mm in the data, representing the maximum error in distortion correction one would obtain by using a static field map was estimated. Therefore, any functional connectivity analysis done in the presence of notable head motion would benefit from MEDIC dynamic distortion corrections. In living participants, motion can never be fully eliminated, even when using external devices such as head restraints to mitigate head motion or sedation, which often is prohibitive in studies. Infants, children, the elderly and patient populations typically have the highest head motion and utilization of ME-fMRI and MEDIC will likely be most beneficial in these groups.

(3) MEDIC provides superior distortion correction due to self-reference. MEDIC field maps generated correction results more similar to group-averaged data than those produced by the TOPUP method. Importantly, this occurred even though the group-averaged data had been distortion-corrected using TOPUP-a circumstance that one would assume would inherently be biased towards TOPUP's performance. Notably, greater correspondence between MEDIC and the group-averaged functional connectivity maps within the medial prefrontal cortex and the occipital regions was observed. In addition, there were still large local distortions even after correction with TOPUP, particularly in the dorsal cortical surface and cerebellum. MEDIC's superior distortion correction capabilities may be attributed to the fact that MEDIC uses field maps sourced from the same data it is correcting. This "self-reference" property provides two main benefits: first, fluctuations in head motion may have led to differences in the measured field, which static field maps only measure at a single point in time, potentially causing inaccurate localization of B0 field inhomogeneities and, consequently, less than ideal distortion correction. Second, a single time point static field map might not accurately estimate the B0 field inhomogeneity of the scan it is meant to correct, leading to suboptimal distortion correction. This can result from a mismatch in acquisition parameters from the fMRI data and the field map data, leading to differences in affected B0 inhomogeneity. In such cases, MEDIC based distortion correction is able to correct for additional off-resonance effects.

(4) On parameter selection in ME-fMRI and MEDIC. Despite the benefits of ME-fMRI, there is a requisite increase in TR due to the collection of additional echoes. For single-echo fMRI acquisitions, echo times are typically around ~30 ms (TE). In multi-echo, any additional echo after this time represents the increase in TR over a single-echo acquisition. For example, for a 3-echo acquisition with echo times of 15 ms, 30 ms, and 45 ms, would require an extra 15 ms per RF pulse compared to a single echo acquisition. This increase in TR can be mitigated if one were to reduce the number of slices, at the cost of a smaller field of view (FOV), or by increasing the parallel imaging acceleration factors, while maintaining the same FOV. Acceleration techniques, including both in-plane undersampling and multi-band (simultaneous multi-slice), are a must if one desires multiple echoes, a TR of ~1 second and resolutions of 2.4 mm or smaller. Most recent ME fMRI sequences seem to utilize 3-5 echoes with the second echo around ~30 ms. The acquisition of higher spatial resolution images is additionally challenging with ME fMRI as even more acceleration is required in order to acquire multiple echoes without unacceptably long readout times and/or TRs. The addition of MEDIC does not largely change these considerations. In this study, relatively late echo times were used (TE1=14.2 ms, TE2=38.93 ms), but still found to be effective at measuring phase and correcting distortion. The use of earlier echo times may improve the performance of MEDIC even further, particularly in areas of high susceptibility. MEDIC only requires the use of two echoes to compute a field map, which is under the typical acquisition of 3-5 echoes. However, in cases where users may want to use larger echo spacings, the identifiability of the field map computation may breakdown, preventing accurate field map estimations. In such cases, more echoes may be preferred to obtain a unique solution.

(5) MEDIC is computationally efficient and open-source. The present open-source implementation of MEDIC is optimized, resulting in computational times comparable to TOPUP for an entire dataset. Overall, the computational time to estimate MEDIC field maps over an entire dataset is generally comparable to the processing time required by TOPUP in its field map estimation process. Computation can be further reduced by running MEDIC's algorithm which may be configured as a parallel algorithm, on a computer with multiple cores. While previous methods of multi-echo dynamic distortion correction have been suggested, lack of functioning open source implementations of such methods have impeded their adoption. The present implementation of MEDIC may be released as an open-source package, which can be found at https://github.com/vanandrew/warpkit. This package is a Python library that can be integrated in a variety of processing pipelines and existing neuroimaging tools with output formats into AFNI (Analysis of Functional NeuroImages), FSL (FMRIB Software Library), and ANTs (Advanced Normalization Tools). This may facilitate the adoption of MEDIC in the neuroimaging community.

(6) Multi-echo frame-wise distortion correction for motion robust fMRI. MEDIC's dynamic, frame-wise distortion correction, is not only conceptually superior to static field-map approaches, but significantly improves the accuracy of fMRI maps, especially in the presence of head motion. MEDIC is easy-to-implement and use and despite computing a dynamic field map at each data frame, is no slower than previously standard static distortion correction (e.g., TOPUP). ME-fMRI is recently gaining popularity more rapidly, at least in part due to its benefits for patient- or individual-specific precision functional mapping (PFM). MEDIC's dynamic distortion correction capability provides another driving reason to acquire multi-echo data. For fMRI applications aiming to maximize spatial precision, such as PFM, or intervention and neuromodulation targeting with fMRI, MEDIC provides yet another powerful reason to switch from single-to multi-echo.

This disclosure uses phase information from ME-fMRI data to dynamically sample distortion due to fluctuating B0 field inhomogeneity across frames by acquiring multiple echoes during a single EPI readout. In the distortion correction approach described herein, MEDIC, accurately estimates B0 related distortions for each frame of ME-fMRI data. The present disclosure demonstrates that MEDIC's frame-wise distortion correction produces improved alignment to anatomy and decreases the impact of head motion on RSFC maps, in higher motion data, when compared to the prior gold standard approach (e.g., TOPUP). Enhanced frame-wise distortion correction with MEDIC, without the requirement for field map collection, furthers the advantage of multi-echo over single-echo fMRI.

The MEDIC approach of this disclosure accurately estimates B0 related distortions for each frame of ME-fMRI data. MEDIC uses phase information from multi-echo echo planar imaging (ME-EPI) data to dynamically sample distortion and is able to capture time-fluctuating B0 field inhomogeneity across frames by acquiring multiple echoes during a single EPI readout. Phase information collected alongside routine magnitude information in a multi-echo MR acquisition can be converted into a field map through phase unwrapping and linear fitting. These field maps are subsequently used to remove distortion using non-linear warping. MEDIC also adds an additional low rank approximation step to remove additional noise components from the field maps, improving the precision of each per frame field map estimation.

MEDIC's frame-wise distortion correction decreases the impact of head motion in all ME-EPI acquisitions, including but not limited to task and resting-state fMRI and diffusion MRI. MEDIC also produces higher quality distortion correction over current gold standard approaches such as FSL TOPUP, due to its ability to correct for additional off-resonance effects such as eddy currents or Maxwell gradients. MEDIC can also be used to measure respiration of a scanner participant in real-time, co-sampled and synced alongside imaging data.

At least some of the problems addressed by the systems and methods described in the present disclosure include: (A) susceptibility to off-resonance effects in the main (B0) magnetic field; (B) local image distortion which prevents accurate localization of anatomical structures; (C) changes in the head position of a scanning participant across fMRI frames, which can cause changes in the B0 field; (D) corrupted field maps (e.g., due to movement), which may prevent distortion correction altogether; (E) significant noise and systematic artifacts (e.g., from head movement) in data; (F) inaccurate field map data, rendering distortion corrections inaccurate; (G) invalid static field map scans; and (H) efficacy of current field map correction techniques.

At least some technical benefits of the systems and methods described in the present disclosure are provided below. (A) Improved distortion correction provided by MEDIC can drive improved targeting of patient specific targets in the context of neuromodulation: patient-specificity, precision, and accuracy are important for successful neuromodulation. Several recent studies have suggested that data driven imaging techniques such as DTI or functional connectivity might improve outcomes while simultaneously improving procedural efficiency. Many of these techniques rely on EPI, and may benefit from the improved distortion correction that MEDIC can provide, through more accurate and precise spatial localization. (B) Decreased impact of head motion in ME-EPI acquisitions. For DBS focused on movement disorders, MEDIC's enhanced robustness to head motion may also enable treatment in more difficult imaging cases. (C) Dynamical sampling of distortion due to fluctuating B0 field inhomogeneity across frames. (D) Accurately estimate distortions for each frame of multi-echo fMRI data. (E) Correcting susceptibility distortions in fMRI data. (F) Improved computing efficiency in neuorimaging computing processes. (G) Improved algorithms in neuroimaging field.

Neurosurgical planning is an essential step for any neurosurgical procedure. Meticulous planning is required to avoid damage to the brain and surrounding structures and to ensure the success of the surgery. Neurosurgical planning involves both anatomical and functional imaging modalities, which highly depends on accurate anatomical/functional image co-registration. Distortion correction with MEDIC may improve co-registration accuracy and this more accurate localization of functional and anatomical structures.

The methods described herein may be implemented using any suitable programming language (including Python, C++, Julia, etc.) on any suitable computing device (including desktop computers, laptop computers, tablet computers, mobile phones, and the like) or other device (e.g., an MR imaging system) including a processor or computing device.

The methods disclosed herein may be integrated in larger fMRI preprocessing pipelines and is compatible with other neuroimaging tools including, for example, FSL, AFNI, and ANTs.

Results

MEDIC Captures Magnetic Field Changes Due to Head Motion

Changes in the B0 magnetic field due to head motion are primarily attributable to the shifting position of susceptibility sources relative to the main magnetic field. Unlike traditional static field map methods, MEDIC field maps capture these dynamic alterations in a frame-wise manner. To demonstrate the efficacy of MEDIC in capturing magnetic field changes due to motion, data was collected while a participant rotated their head about each of the cardinal axes, in addition to acquiring data in a neutral head position. Dynamic field maps were then extracted from the phase information of the resulting scans using MEDIC. The difference between field maps acquired in the neutral and rotated head positions was subsequently calculated (Neutral-Rotation). Average and standard deviation motion parameters for each head position (shown in FIG. 7A, described later).

As the participant rotated their head relative to the neutral resting head position, changes were observed in the B0 field estimated from the frame-wise field maps (shown in FIGS. 1A and 1B, described later). To measure the change in B0 inhomogeneity due to head motion, the field maps for each head rotation were rigid-body realigned to the neutral head position and the difference was computed (Neutral-Rotation). Exemplar frames of the acquired data show the participant rotating their head along each of the cardinal axes in the scanner throughout the time series (shown in FIG. 1A, described later). Rotations about the slice direction (z-axis) led to small changes in the field map (shown in FIG. 1B, described later). In contrast, rotations about the readout (x-axis) and phase encoding (y-axis) directions caused significant changes in the field map (shown in FIG. 1B, described later), indicating that MEDIC-derived field maps are sensitive to changes in the B0 field due to motion. For the particular ME-fMRI sequence used, for every change of 10 Hz in the B0 field, each voxel is displaced by ~0.6 mm. For rotations about the slice direction, similar, but small, spatial patterns in the field map difference as in rotations about the phase encoding direction were observed. These similarities may largely be attributed to the small y-axis rotations present in the z-axis rotation data (shown in FIG. 7A, described later).

Figure 1B:
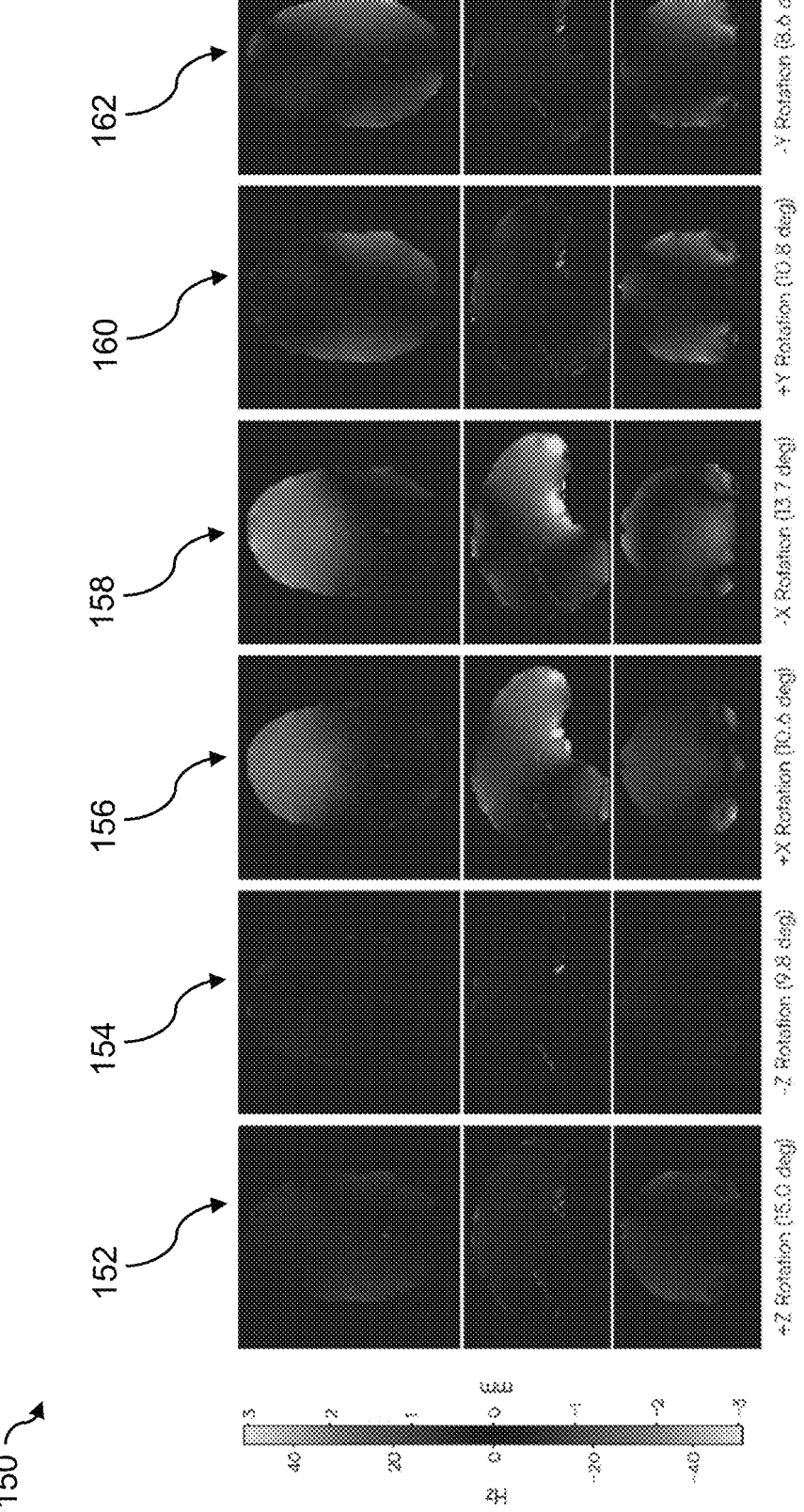
FIG. 1B is a diagram illustrating field maps for the rotated head position in FIG. 1A.

FIGS. 1A and 1B illustrate changes in main magnetic field (B0) inhomogeneity due to head rotation. To assess the effects of head motion on the B0 magnetic field, the participant rotated their head about each of the three cardinal axes: rotations about the (z) slice axis (e.g., yaw), rotations about the (x) readout axis (e.g., pitch), and rotations about the (y) phase encoding axis (e.g., roll). Each rotated head position was held for 100 frames (~3 minutes). FIG. 1A illustrates a group of selected images 100 from the fMRI time series as the participant rotated their head about each axis (e.g., ~700 frames: ~20 minutes), including columns of images 102, 104, 106, 108, 110, 112, and 114. Images 102 reflect ~1 to 100 frames, images 104 reflect ~101 to 200 frames, images 106 reflect ~201 to 300 frames, images 108 reflect ~301 to 400 frames, images 110 reflect ~401 to 500 frames, images 112 reflect ~501 to 600 frames, and images 114 reflect ~601 to 700 frames. FIG. 1B illustrates group of field maps 150 for each rotated head position were computed using MEDIC and compared to the MEDIC field map computed in the neutral (e.g., no rotation) head position, including columns of images 152, 154, 156, 158, 160, and 162. The average magnitude of rotation about each major axis is listed for each column and corresponds to each rotated head position in FIG. 1A. Images 152 correspond to +Z rotation (15.0 deg.). Images 154 correspond to −Z rotation (9.8 deg.). Images 156 correspond to +X rotation (10.6 deg.). Images 158 correspond to −X rotation (13.7 deg.). Images 160 correspond to +Y rotation (10.8 deg.). Images 162 correspond to −Y rotation (8.6 deg.). Warmer colors indicate an increase in the B0 inhomogeneity and a voxel shift that is more posterior than the neutral position, while cooler colors indicate the opposite.

MEDIC Dynamic Distortion Correction Reduces the Impact of Head Motion on Functional Connectivity Estimates To assess the effects of these changes on RSFC analyses, as well as the ability for MEDIC to mitigate these B0 field change effects, the functional connectivity maps of data derived from this head motion study were compared to a low motion dataset from the same participant. These data were preprocessed (e.g., as described below in METHODS) and distortion corrected separately using both MEDIC and FSL TOPUP, the current gold standard in distortion correction. A separately acquired field map scan in the neutral head position (e.g., images 102 (e.g., frame 50) shown in FIG. 1A) was used for TOPUP distortion correction, reflecting a typical data acquisition experiment of a single field map acquisition at the beginning of a functional scan (shown in FIG. 7A, described later). Both MEDIC and TOPUP preprocessed data were projected to the surface. Functional connectivity maps were computed from seeds in the dorsolateral prefrontal cortex (DLPFC), the occipital cortex (e.g., extrastriate visual cortex), and the somato-cognitive action network (SCAN) region of primary motor cortex. To assess the effectiveness of distortion correction, the quality of these maps were evaluated by comparing them to a large, low-motion dataset from the same participant, processed with TOPUP.

The exemplar seed maps show that high motion MEDIC corrected data were more similar to the low motion data than TOPUP corrected high motion data, despite the low motion (e.g., gold standard) data being processed with TOPUP (shown in FIGS. 2A to 2C, described later). Greater improvement in similarity to the low motion data was observed in DLPFC and occipital cortex (shown in FIGS. 2A and 2B, described later) compared to somato-cognitive action network (SCAN) (shown in FIG. 2C, described later). It was observed that the mean correlation between high-motion MEDIC-corrected seed maps and low-motion seed maps was R=0.35 (SD:0.16). In contrast, the mean correlation between high-motion TOPUP-corrected seed maps and low-motion data was R=0.32 (SD:0.15). Using a two-tailed paired t-test, this difference was found to be statistically significant (two-tailed paired t=64.13; p<0.001; df=59411), indicating that MEDIC corrected data is more similar to low motion corrected data and has greater robustness to head motion.

Figures 2A, 2B, 2C:
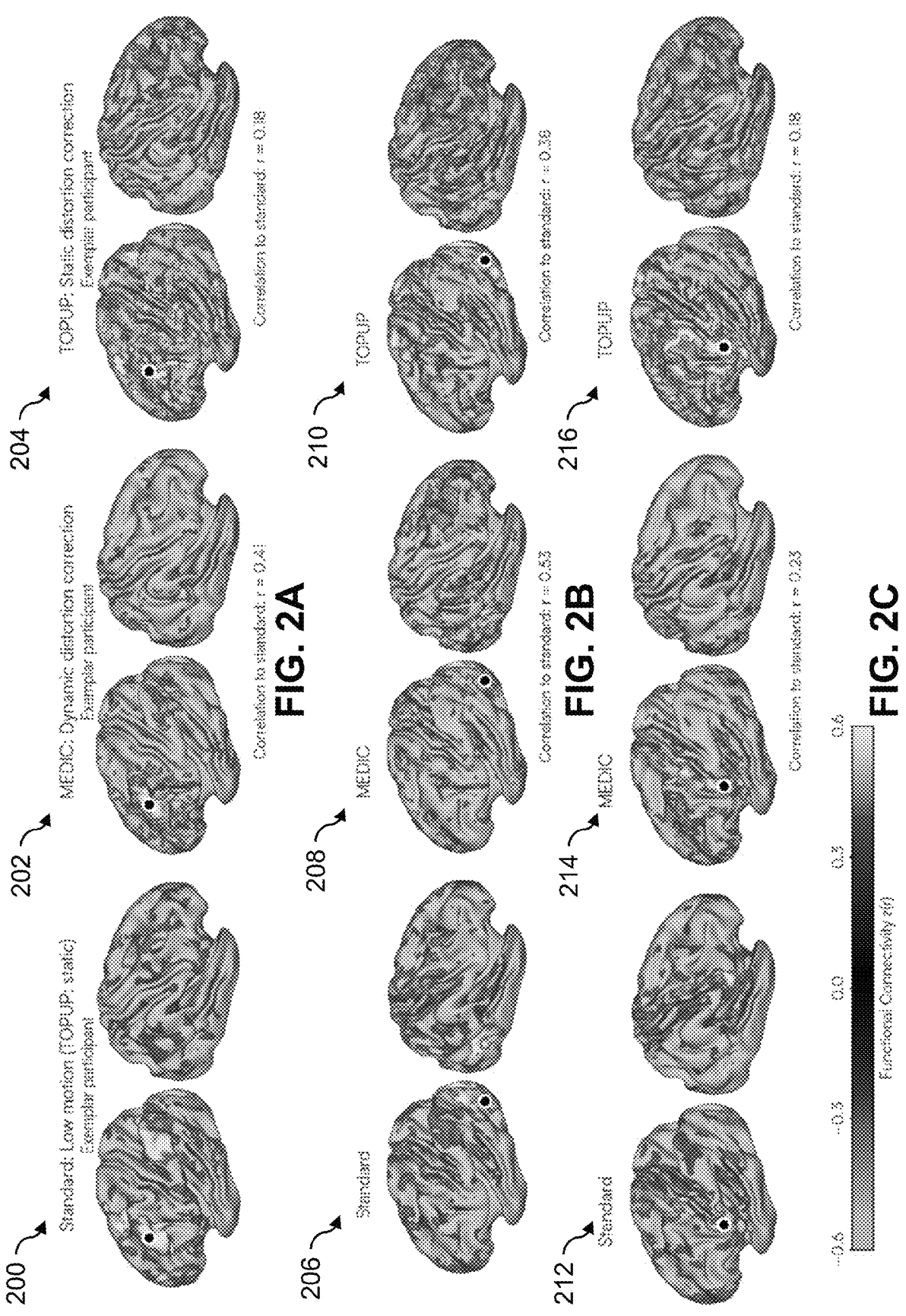
FIG. 2A is a diagram illustrating a comparison between standard, MEDIC, and TOPUP distortion correction for dorsolateral prefrontal cortex (DLPFC) functional connectivity seed maps.
FIG. 2B is a diagram illustrating a comparison between standard, MEDIC, and TOPUP distortion correction for occipital cortex functional connectivity seed maps.
FIG. 2C is a diagram illustrating a comparison between standard, MEDIC, and TOPUP distortion correction for somato-cognitive action network (SCAN) functional connectivity seed maps.

FIGS. 2A, 2B, and 2C illustrate a comparison of dynamic (MEDIC) and static (TOPUP) distortion correction in high motion data. To compare the effects of each distortion correction method (e.g., MEDIC vs. TOPUP) on high motion data (e.g., 700 frames: ~ 20 minutes) the data were processed identically. FIG. 2A illustrates functional connectivity (FC) seed maps for DLPFC. FC seed map 200 illustrates standard, low motion (e.g., TOPUP: static). FC seed map 202 illustrates MEDIC dynamic distortion correction. FC seed map 204 illustrates TOPUP static distortion correction. FIG. 2B illustrates functional connectivity (FC) seed maps for occipital cortex (extrastriate visual). FC seed map 206 illustrates standard, low motion (e.g., TOPUP: static). FC seed map 208 illustrates MEDIC dynamic distortion correction. FC seed map 210 illustrates TOPUP static distortion correction. FIG. 2C illustrates functional connectivity (FC) seed maps for SCAN. FC seed map 212 illustrates standard, low motion (e.g., TOPUP: static). FC seed map 214 illustrates MEDIC dynamic distortion correction. FC seed map 216 illustrates TOPUP static distortion correction.

On the left most side of FIGS. 2A, 2B, 2C (e.g., which includes maps 200, 206, 212), a low motion dataset (e.g., 5,100 frames: ~150 minutes) of the same participant processed using TOPUP was used as a reference for comparison. The middle of FIGS. 2A, 2B, 2C (e.g., which includes maps 202, 208, 214) and right of FIGS. 2A, 2B, 2C (e.g., which includes maps 204, 210, 216) columns show the resulting resting-state functional connectivity maps for high motion data processed with each distortion correction method (e.g., also shown in FIG. 7A for the TOPUP field map used, described later) and Fisher-z transformed. Seeds in DLPFC (e.g., FIG. 2A), occipital cortex (e.g., FIG. 2B), and SCAN (e.g., FIG. 2C) were placed to review the effectiveness of correction and are marked by a black dot. Correlations between standard (low motion data, e.g., maps 200, 206, 212), MEDIC (high motion data, e.g., maps 202, 208, 214), and TOPUP (high motion data, e.g., maps 204, 210, 216) in each seed are displayed under each seed map. Seed maps are thresholded to only display connectivity values above |r|>0.25 for easier visualization. As described above, MEDIC corrected data is more similar to low motion corrected data and has greater robustness to head motion.

MEDIC Dynamic Distortion Correction Improves Functional Connectivity in Pediatric Populations Uncorrected geometric distortion introduces participant-to-participant variability in RSFC structure. Improved distortion correction was reasoned to produce individual RSFC estimates that align more closely with a group average. To accomplish this, MEDIC and TOPUP distortion-corrected FC maps were compared to gold-standard group-averaged data, processed with TOPUP (e.g., ABCD Study; N=3,928). An adolescent dataset containing repeated-sampling precision ME-fMRI data from 21 participants (9-12 years old, 8M, 13F), with a total of 185 runs was used. These ME-fMRI data were preprocessed with both MEDIC and TOPUP for resting-state functional connectivity analyses as described herein.

Seeds maps from both MEDIC and TOPUP processed data were compared to the ABCD group-averaged data (shown in FIG. 3A, left (e.g., map 300), described later). In the occipital cortex, the TOPUP corrected data showed correlations not observed in the ABCD group (shown in FIG. 3A, right (e.g., map 302), described later): seed correlation to group-averaged data r=0.04 that were removed by reprocessing the identical data with MEDIC (shown in FIG. 3A, middle (e.g., map 304), described later): seed correlation to group-averaged data r=0.44 (e.g., Squared Error: MEDIC=0.03 (SD: 0.07), TOPUP=0.07 (SD: 0.10); two-tailed paired t=−84.6; p<0.001; df=59411).

Figure 3A:
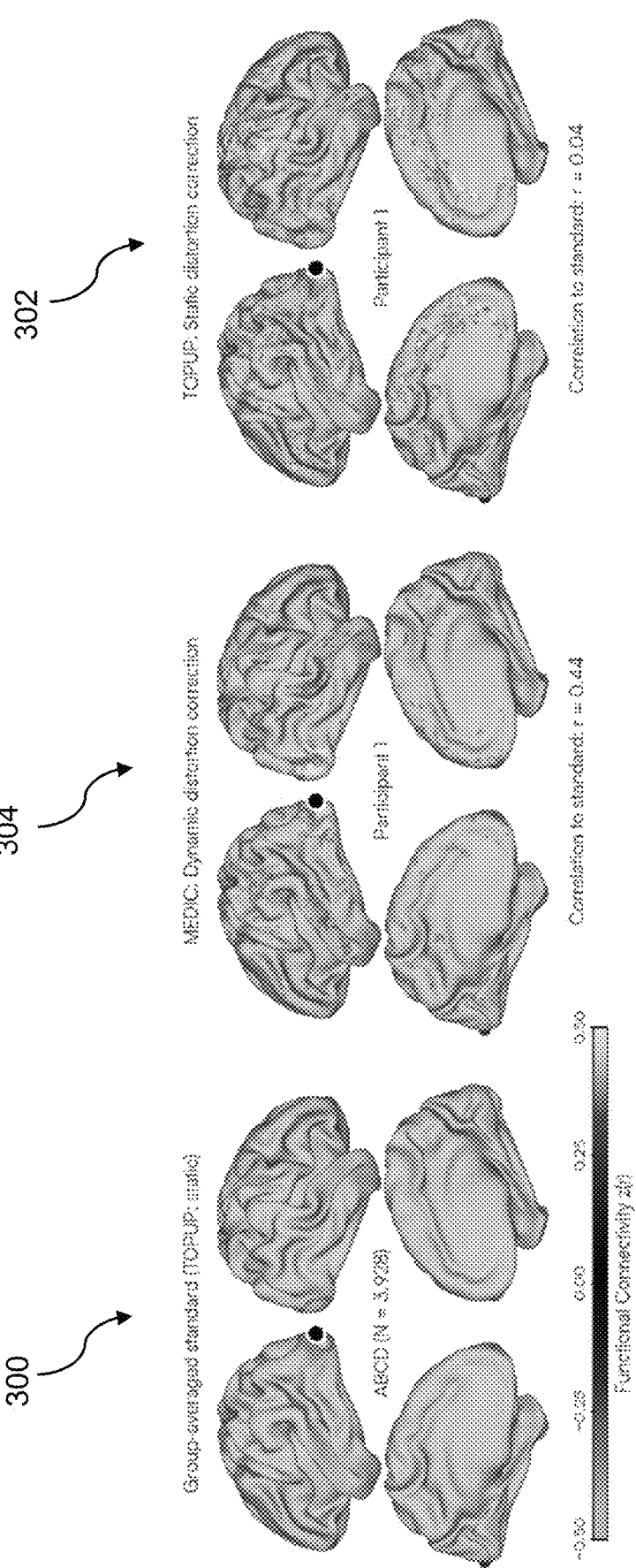
FIG. 3A is a diagram illustrating a comparison between standard, MEDIC, and TOPUP distortion correction for occipital cortex resting-state functional connectivity seed maps.
Figure 3B:
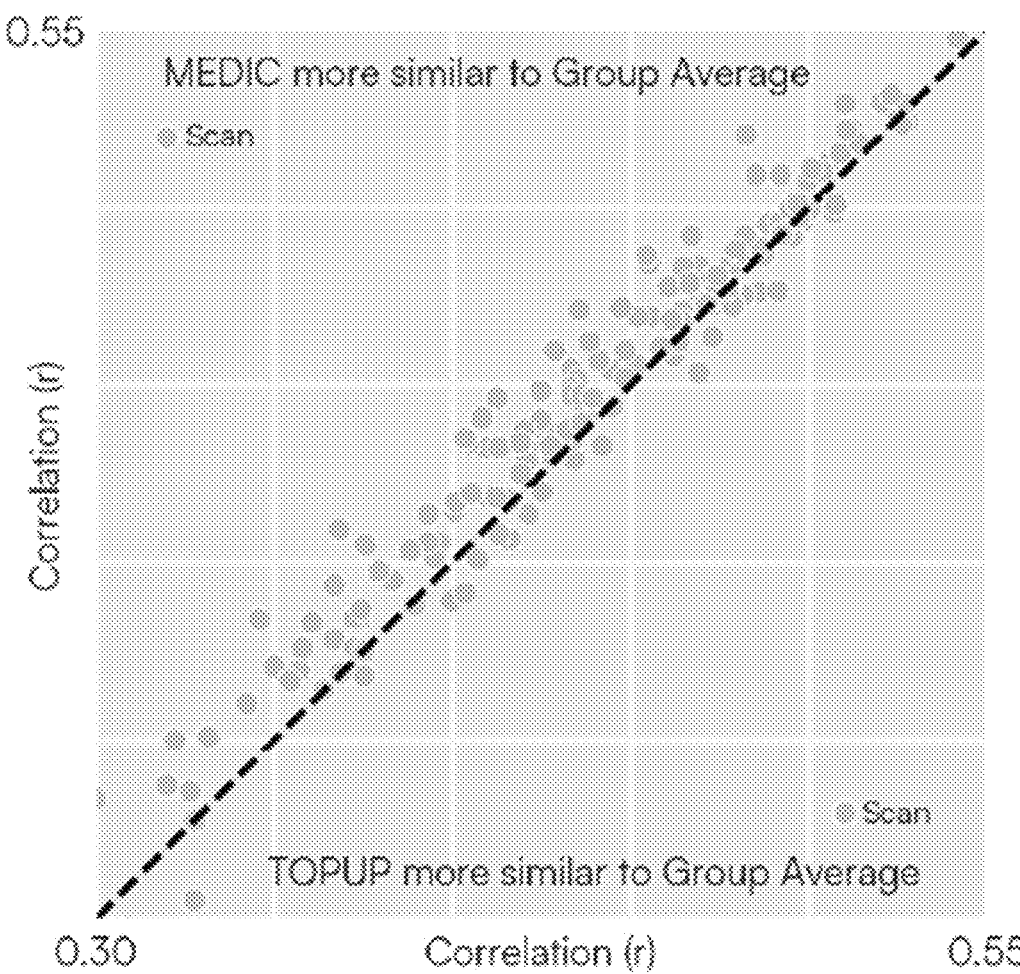
FIG. 3B is a plot illustrating a mean correlation of each scan for the standard dataset of FIG. 3A.
Figure 3C:
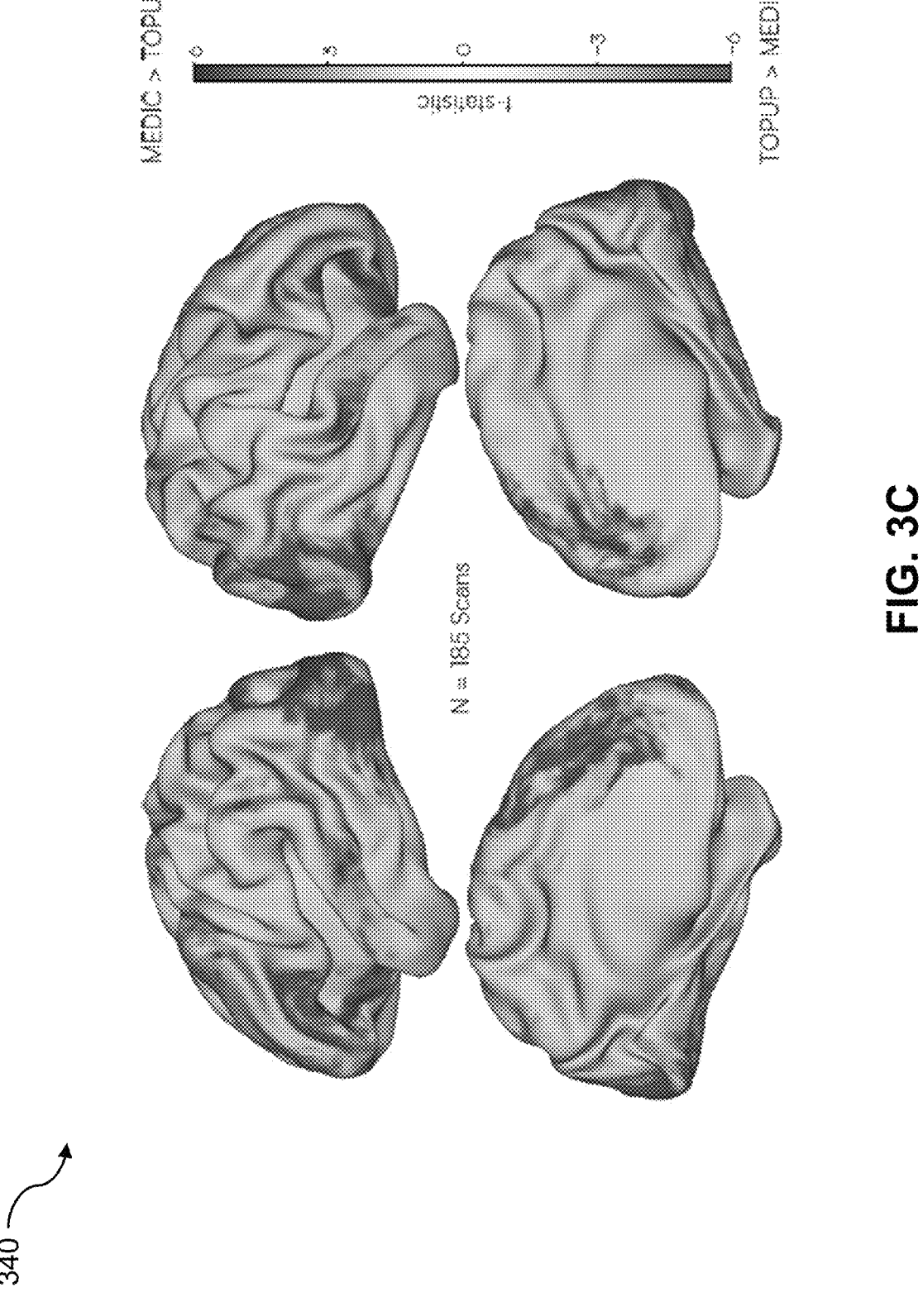
FIG. 3C is a diagram illustrating a T-statistic map representing spatial distribution of similarity to mean correlation of each scan for the standard dataset of FIG. 3A.

FIGS. 3A, 3B, and 3C illustrate a comparison of dynamic (MEDIC) and static (TOPUP) distortion correction against large-sample group-averaged data. FIG. 3A illustrates resting-state functional connectivity maps 300, 302, and 304 from a single scan (~16 minutes) in the Adolescent dataset (N=185). A seed placed in the occipital cortex (e.g., primary visual) is indicated by a black dot. Seed maps are displayed for data corrected using MEDIC (middle map 304) and TOPUP (right map 302) and compared to a functional connectivity map computed from the ABCD group (N=3, 928) average (left map 300). Seed maps are thresholded to only display connectivity values above |r|>0.3 for easier visualization.

FIG. 3B illustrates a plot 320 for mean correlation of each scan from the Adolescent dataset to the ABCD group average. Each dot represents the mean similarity of a single scan (~10-16 min) of the Adolescent dataset to the ABCD group average. The y-axis represents the similarity to the ABCD group average using MEDIC correction while the x-axis represents the similarity for the TOPUP corrected version of the same data. The unity line represents the case where the MEDIC and TOPUP corrections achieved the same similarity to the group-averaged standard. Points that are orange and above the unity line indicate MEDIC corrected data that were on average more similar to the ABCD group average than TOPUP corrected data. Blue dots that are below the unity line indicate the opposite.

FIG. 3C illustrates a T-statistic map 340 representing the spatial distribution of similarity to the ABCD group average. Each vertex on the surface represents a t-statistic value, estimated using a two-tailed paired t-test across all 185 scans of the Adolescent dataset between MEDIC and TOPUP correction. Warmer (e.g., red) colors indicated that MEDIC correction had higher similarity to the ABCD group average compared to TOPUP for that vertex, while cooler (e.g., blue) colors indicate the opposite.

To quantify the benefits of dynamic distortion correction with MEDIC across the entire Adolescent dataset, cortical seed maps at every vertex for each scan were compared to the corresponding group-averaged standard map (ABCD) through spatial correlations. These spatial correlations were then averaged across all vertices (shown in FIG. 3B; y-axis). The same assessment was done with TOPUP (shown in FIG. 3B; x-axis). MEDIC corrected data were overall more similar to the ABCD group average compared to TOPUP corrected data (MEDIC:147; TOPUP:38; two-tailed paired t=9.37; p<0.001; df=184).

Finally, one goal was to understand the regions in which MEDIC improved distortion correction. The spatial pattern of distortion correction differences by doing a vertex-wise paired t-test to generate a vertex-wise t-statistic whole-brain map showing those regions where MEDIC was more similar to the group-averaged data (shown in FIG. 3C; hot colors) was examined. A clustering based multiple comparisons correction was applied to correct to a significance level of 0.05 (uncorrected p-value 0.01) and leaving only statistically significant clusters. This whole-brain map of similarity to the group average revealed that the benefits of using MEDIC dynamic distortion correction were greatest in the medial prefrontal and occipital cortex (shown in FIG. 3C).

MEDIC Frame-Wise Distortion Correction Produces Superior Anatomical Alignment One goal of distortion correction is to improve co-registration of the fMRI to the anatomical data. Therefore, alignment accuracy by using the gray and white matter surfaces generated from anatomical segmentations was assessed. When distortion correction is optimal, the gray and white matter surfaces obtained from anatomical data should also delineate the gray and white matter voxels in functional data on both the cortical and cerebellar surfaces. For this assessment, data from three separate SIEMENS Prisma MRI scanners at three different institutions were processed and distortion corrected using MEDIC and TOPUP: Washington University in St. Louis (WashU, selected participant from the Adolescent dataset), University of Minnesota (UMinn), and University of Pennsylvania (Penn). Participants from three different scanning sites were used to eliminate scanner-specific effects in the comparison between MEDIC and TOPUP anatomical alignment. Gray and white matter surfaces produced by anatomical segmentations from analysis and visualization software (e.g., software for the analysis and visualization of structural, functional, and diffusion neuroimaging data from cross-sectional and longitudinal studies, such as Freesurfer (e.g., Freesurfer 7.3.2)) were overlaid on the averaged, atlas-aligned, distortion corrected functional volumes.

Field map differences between MEDIC and TOPUP were found to occur along the slice-encoding direction for all participants (shown in FIGS. 4A to 4C, described later). In regions with large MEDIC-TOPUP distortion differences (shown in FIGS. 4A to 4C, top row (e.g., including field map image 400 in FIG. 4A, field map image 406 in FIG. 4B, and field map image 412 in FIG. 4C, each described later), observable differences in registration to anatomy was exhibited. In all of these regions, the MEDIC image was better aligned to the anatomy than the TOPUP image.

Figures 4A, 4B, 4C:
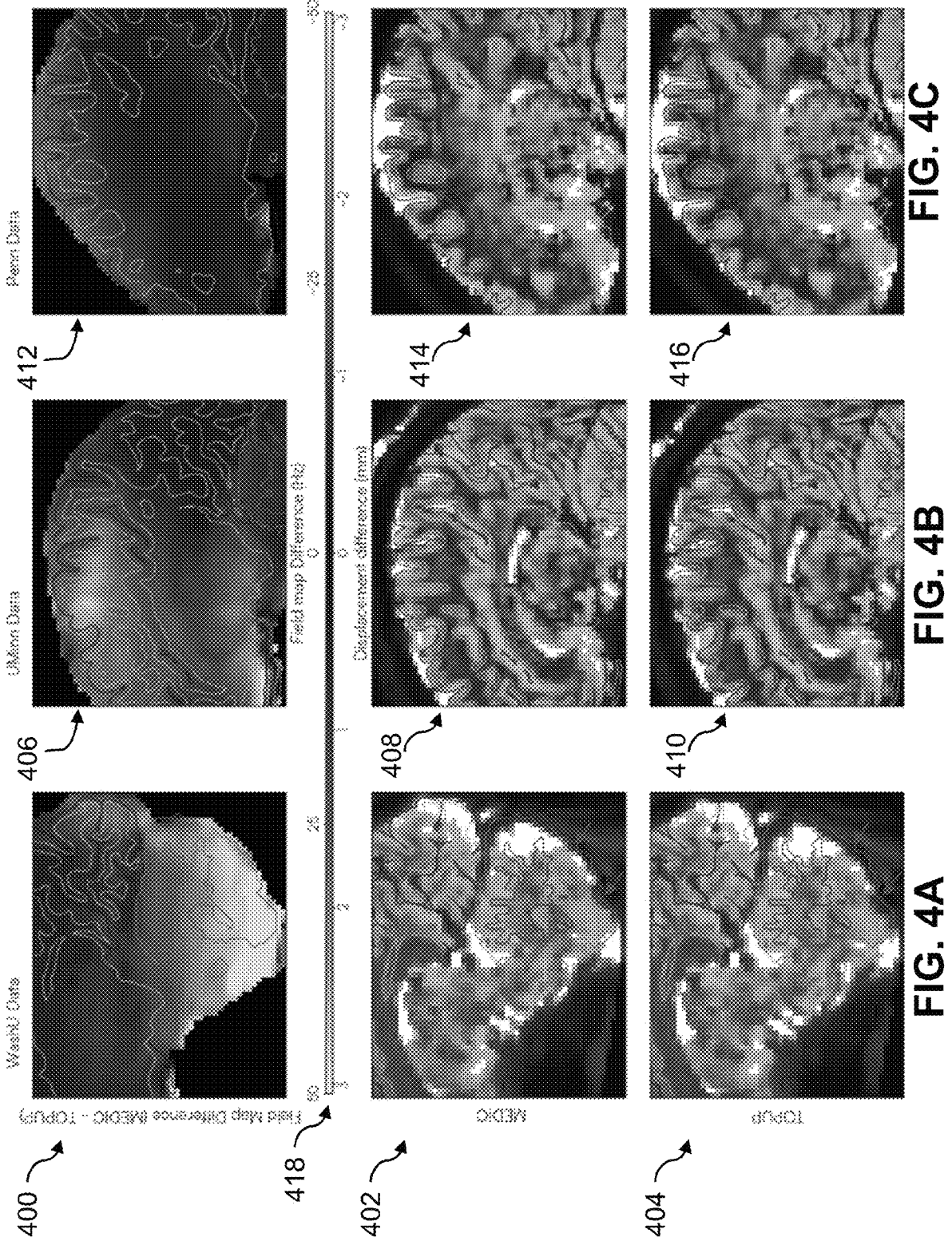
FIG. 4A is a diagram illustrating a comparison of anatomical surface alignment after dynamic MEDIC and static (TOPUP) distortion correction for a first dataset.
FIG. 4B is a diagram illustrating a comparison of anatomical surface alignment after dynamic MEDIC and static (TOPUP) distortion correction for a second dataset.
FIG. 4C is a diagram illustrating a comparison of anatomical surface alignment after dynamic MEDIC and static (TOPUP) distortion correction for a third dataset.

FIGS. 4A, 4B, and 4C illustrate comparisons of anatomical surface alignment after dynamic (e.g., MEDIC) and static (e.g., TOPUP) distortion correction. Gray and white matter boundaries (e.g., blue and green outlines respectively for cortex; fuchsia and teal outlines respectively for cerebellum) were derived from software (e.g., Freesurfer) anatomical segmentations. Good alignment occurs when segmentation surfaces correctly delineate gray and white matter boundaries of the underlying functional data. Each column of images shows ME-fMRI data obtained from three different scanning sites: FIG. 4A illustrates a first dataset (e.g., obtained by WashU, selected participant from Adolescent dataset), FIG. 4B illustrates a second dataset (e.g., obtained by UMinn), and FIG. 4C illustrates a third dataset (e.g., obtained by Penn). The collective top row (e.g., map images 400, 406, 412) spanning FIGS. 4A-4C shows the difference (e.g., MEDIC-TOPUP) in field maps between MEDIC (e.g., maps 402, 408, 414) and TOPUP (e.g., map images 404, 410, 416). Colorbar 418 denotes the magnitude of these differences, where warmer colors indicate TOPUP field maps (e.g., map images 404, 410, 416) had a lower B0 frequency and have a displacement that is more anterior compared to MEDIC for a particular voxel. The middle row (e.g., including map images 402, 408, 414) and bottom row (e.g., including map images 404, 410, 416) show anatomical surface overlays on the averaged, atlas-aligned ME-fMRI data. Red arrows indicate areas that MEDIC corrected data was more saliently aligned to the anatomical data compared to TOPUP corrected data.

In the first dataset (e.g., map images 400, 402, 404 of FIG. 4A), the most prominent difference was observed in the cerebellum. In the TOPUP corrected data in map image 404 the inferior cerebellum was shifted approximately 3 mm anteriorly compared to the anatomical segmentation reference. MEDIC corrected data in map image 402 closely aligned with the cerebellar anatomy, suggesting a higher efficacy for cerebellar alignment. For the second dataset (e.g., map images 406, 408, 410 of FIG. 4B), discrepancies in the dorsal cerebral cortex were identified. The sulci in the TOPUP corrected images (e.g., map image 410) were shifted 2-3 mm anteriorly relative to the anatomical reference. In contrast, the MEDIC corrected data (e.g., map image 408) showed a good agreement with the cortical anatomy. Finally, in the third dataset (shown in FIG. 4C), a distortion profile similar to that of the second data was observed. Specifically, the greatest differences appeared in the dorsal cortical region. The TOPUP corrected data (e.g., map image 416) displayed a 1-2 mm anterior shift in cortical structures relative to the anatomical reference. Meanwhile, the MEDIC corrected data (e.g., map image 414) maintained good alignment with the cortical anatomy.

Figures 7A, 7B:
FIG. 7A is a table illustrating rigid-body alignment parameters for head motion data.
FIG. 7B is a table illustrating anatomical alignment metrics comparing MEDIC and TOPUP distortion correction methods.

MEDIC Distortion Correction is Superior on Local and Global Anatomical Alignment Metrics To quantify anatomical alignment performance for MEDIC and TOPUP, established local and global alignment metrics between distortion corrected functional data and their corresponding T1w and T2w anatomical data were computed (full statistical tables for each alignment metric are shown in FIG. 7B, described later). All alignment metrics for the Adolescent dataset across 185 scans from 21 participants in both MEDIC and TOPUP corrected data were computed.

To assess local image correspondence, squared correlation (R2) within a "spotlight" was computed. The "spotlight" may be configured as a 3 voxel radius sphere window between each of T1w and T2w anatomical and the reference functional image. Two-tailed paired t-tests were computed for each voxel across all functional data scans in the Adolescent dataset (N=185) to determine which distortion correction strategy was more similar to the anatomy at a local spotlight. Clustering-based multiple comparisons correction was applied to correct to a significance level of 0.05 (uncorrected p-value 0.01). Higher t-statistic values indicated MEDIC was more similar to the anatomical image than TOPUP (shown in FIGS. 5A and 5B, described later). MEDIC distortion corrected data had higher local similarity to the anatomical data than TOPUP distortion corrected data in gray matter. Areas where TOPUP performed better were restricted to areas of white matter and CSF, particularly in white matter areas adjacent to the lateral ventricle.

Figures 5A, 5B:
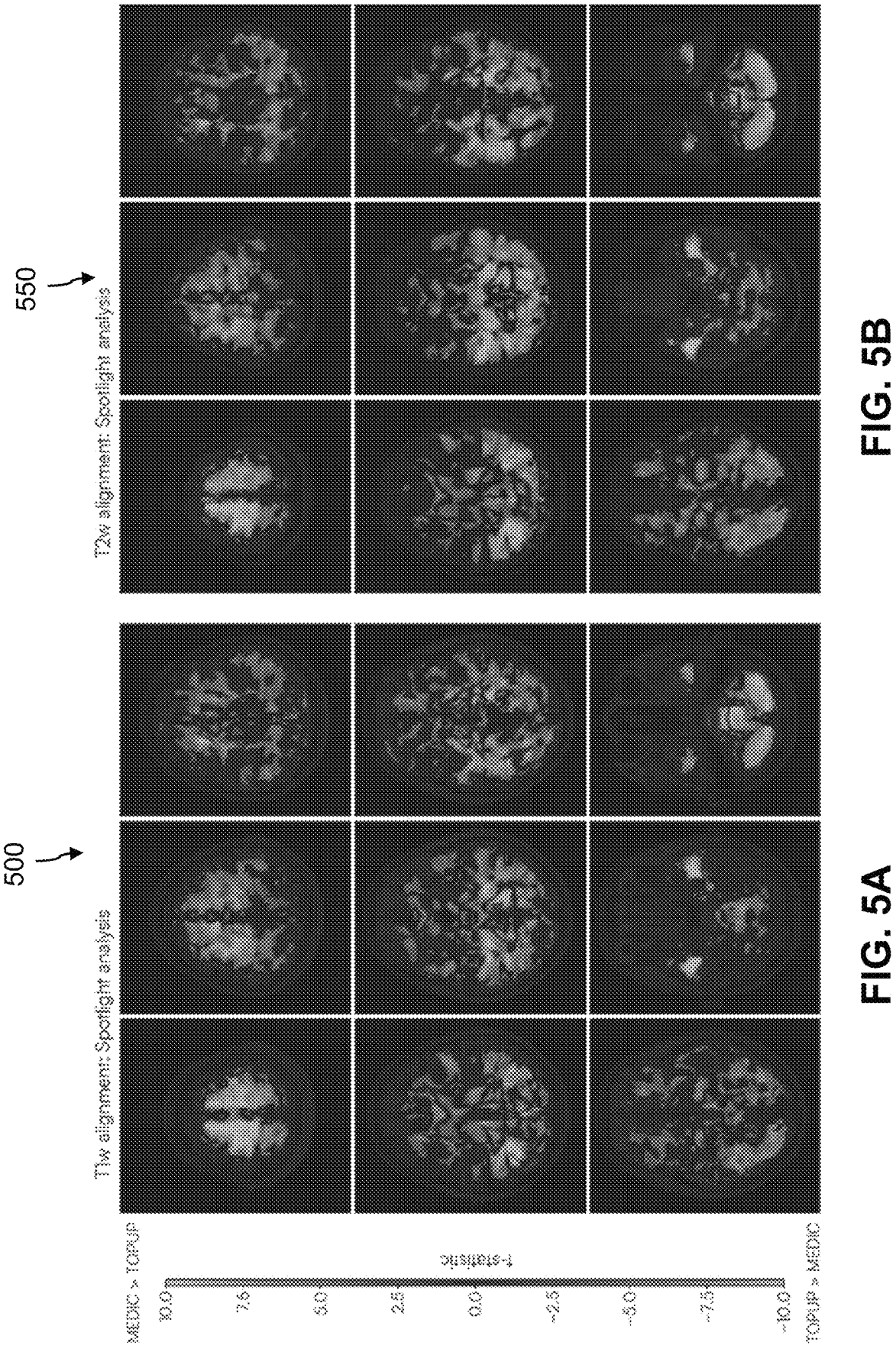
FIG. 5A is a diagram illustrating a t-statistic between MEDIC and TOPUP for a spotlight assessment of local similarity between corrected functional and T1w anatomical data.
FIG. 5B is a diagram illustrating a t-statistic between MEDIC and TOPUP for a spotlight assessment of local similarity between corrected functional and T2w anatomical data.

FIGS. 5A and 5B illustrate spotlight assessment of local similarity between distortion corrected functional and T1w/T2w anatomical data. FIG. 5A illustrates images 500 for spotlight analysis of T1w alignment. FIG. 5B illustrates images 550 for spotlight analysis of T1w alignment. T-statistic maps from local R2 values were computed using a 3 voxel radius "spotlight" moving across the entire image. FIG. 5A shows the t-statistic between MEDIC and TOPUP for each R2 spotlight between the functional image and the T1w anatomical image, while FIG. 5B shows the t-statistic between MEDIC and TOPUP for each R2 spotlight between the functional image and the T2w anatomical image. Warmer colors indicate MEDIC corrected data had higher local similarity to anatomy compared to TOPUP corrected data.

Further quantifying the local similarity, the mean of R2 values across all spotlights for each scan (shown in FIG. 6A, described later) was computed. MEDIC significantly outperformed static TOPUP correction in both the T1w R2 spotlight (MEDIC=0.068 (SD: 0.007); TOPUP=0.066 (SD: 0.008); two-tailed paired t=7.133; p <0.001; df=184) and T2w R2 spotlight (MEDIC=0.083 (SD: 0.010); TOPUP=0.081 (SD: 0.011); two-tailed paired t=6.124; p<0.001; df=184) analyses.

Figure 6A:
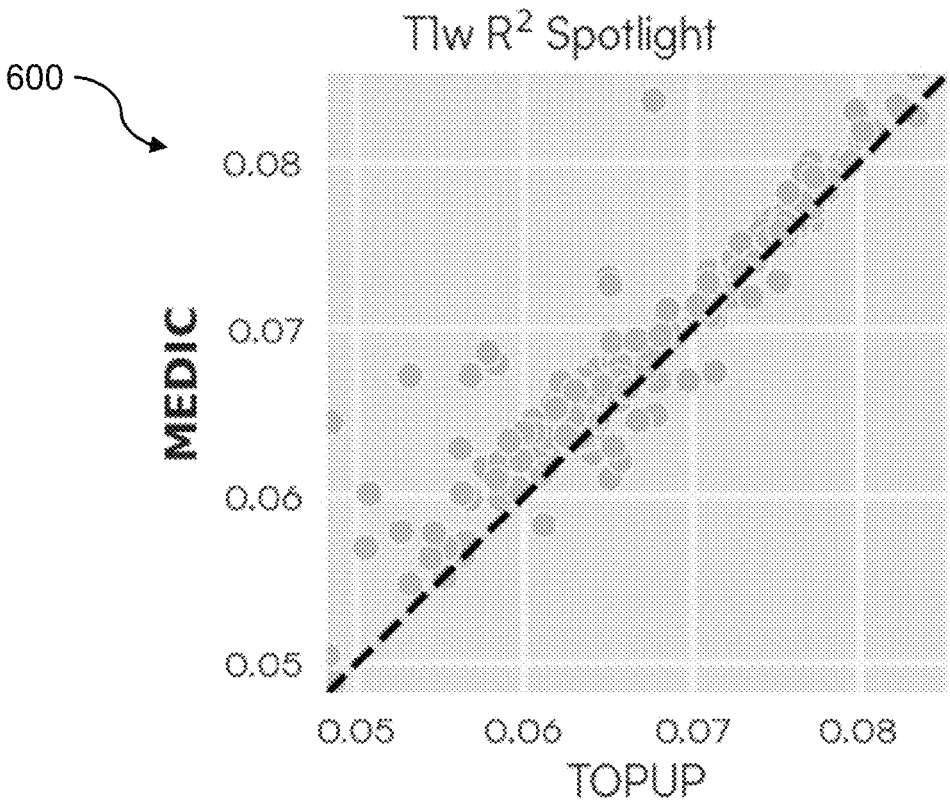
FIG. 6A is a plot illustrating a T1w R2 spotlight for anatomical alignment metrics comparing MEDIC and TOPUP distortion correction methods.
Figure 6B:
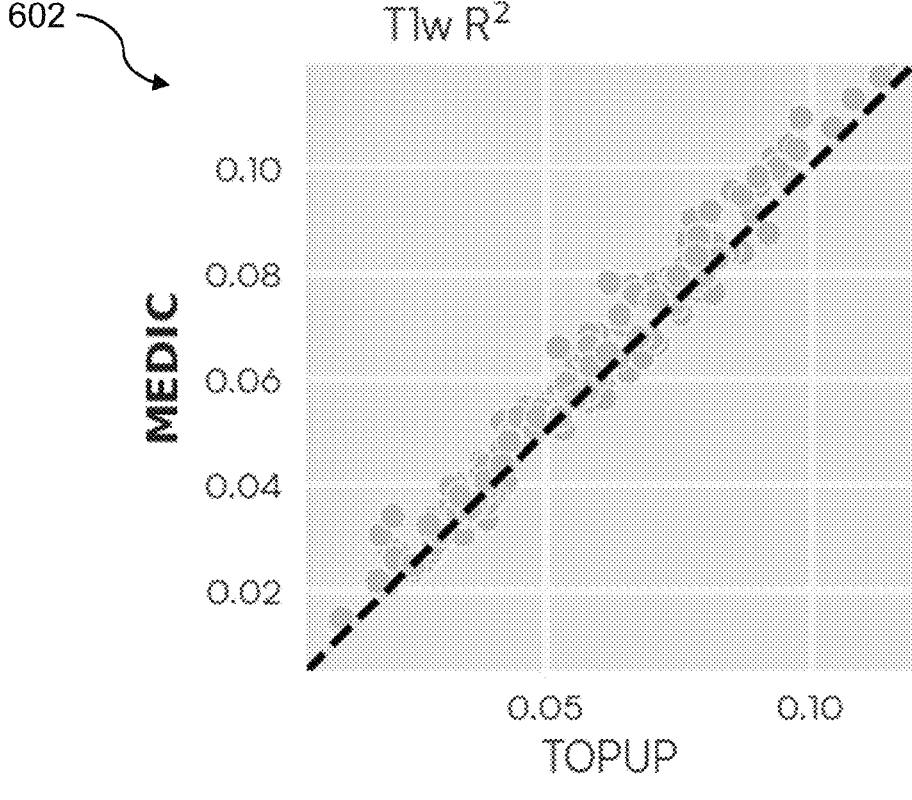
FIG. 6B is a plot illustrating T1w R2 global analytics for anatomical alignment metrics comparing MEDIC and TOPUP distortion correction methods.
Figure 6C:
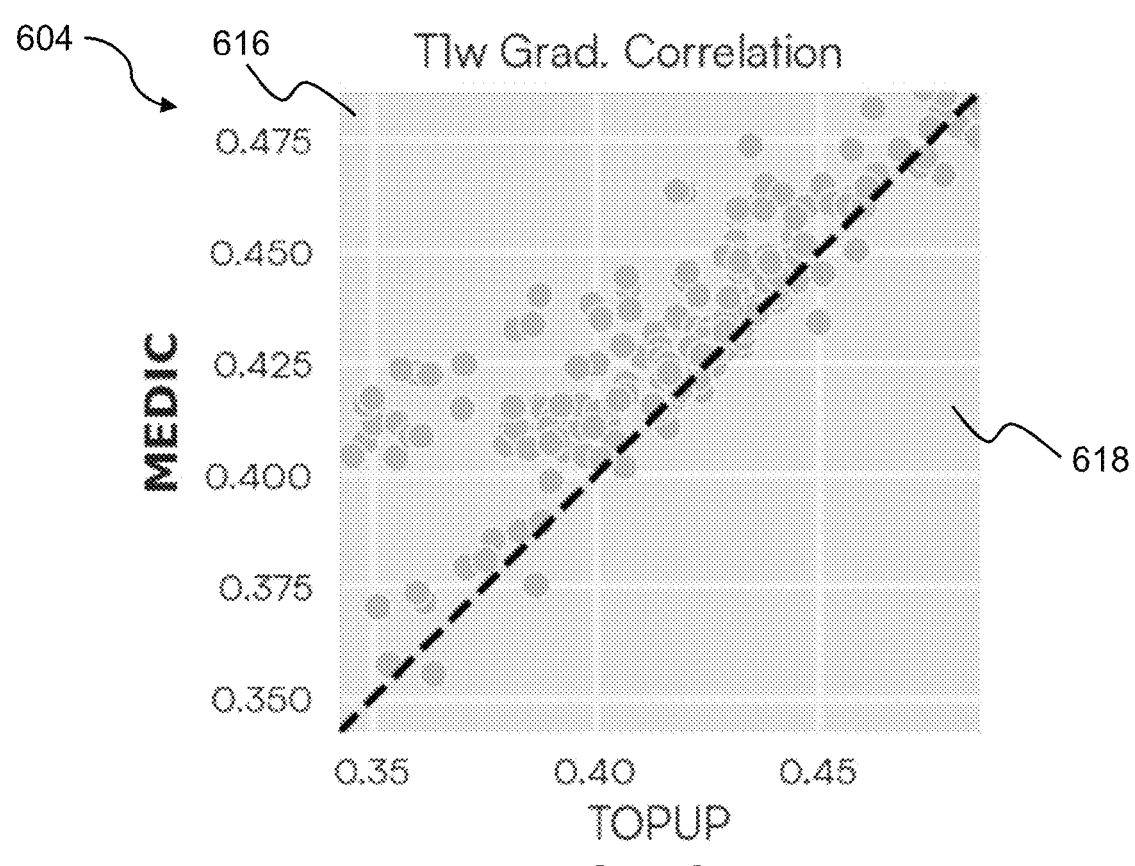
FIG. 6C is a plot illustrating a T1w gradient magnitude correlation for anatomical alignment metrics comparing MEDIC and TOPUP distortion correction methods.
Figure 6D:
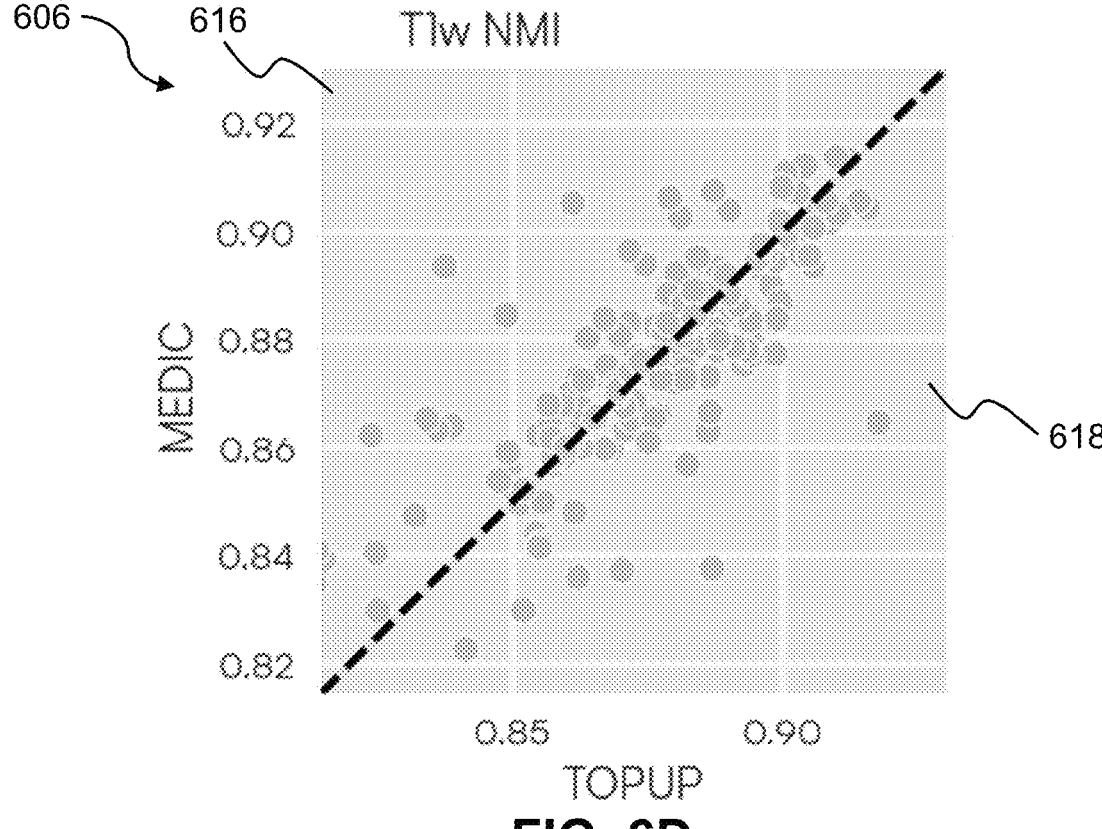
FIG. 6D is a plot illustrating a T1w normalized mutual information for anatomical alignment metrics comparing MEDIC and TOPUP distortion correction methods.
Figure 6E:
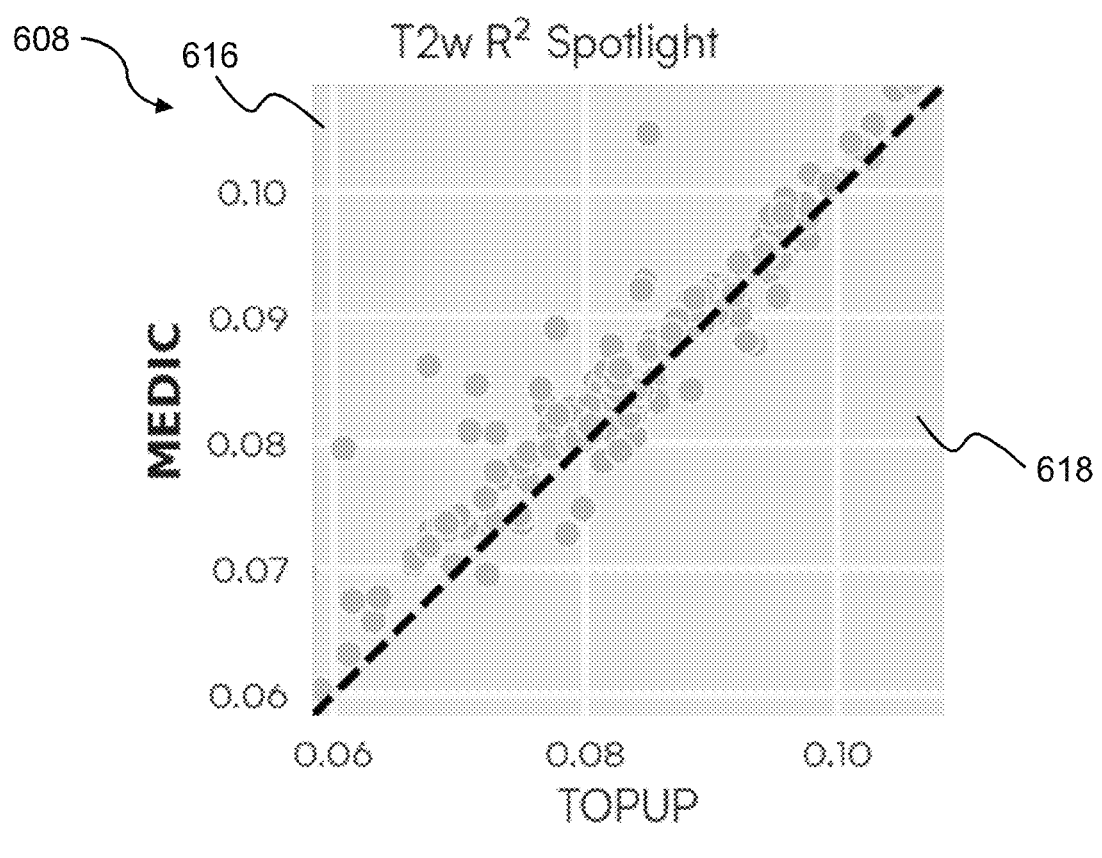
FIG. 6E is a plot illustrating a T2w R2 spotlight for anatomical alignment metrics comparing MEDIC and TOPUP distortion correction methods.
Figure 6F:
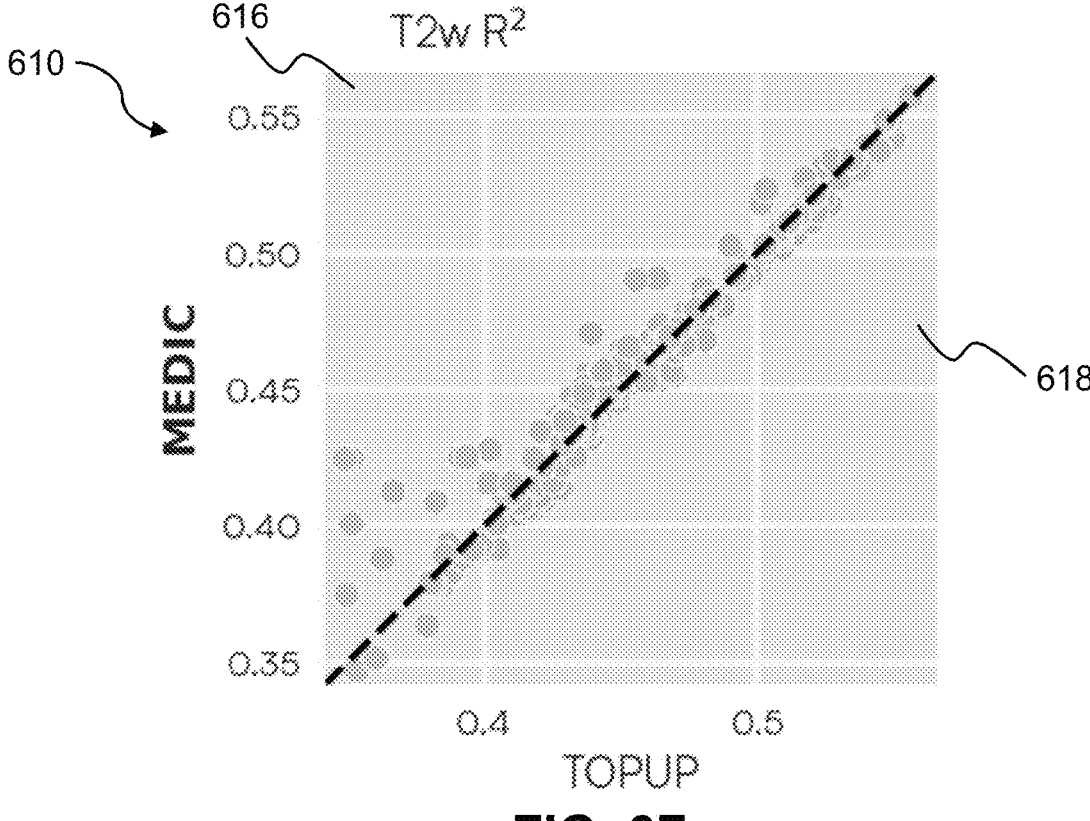
FIG. 6F is a plot illustrating T2w R2 global analytics for anatomical alignment metrics comparing MEDIC and TOPUP distortion correction methods.
Figures 6G, 6H:
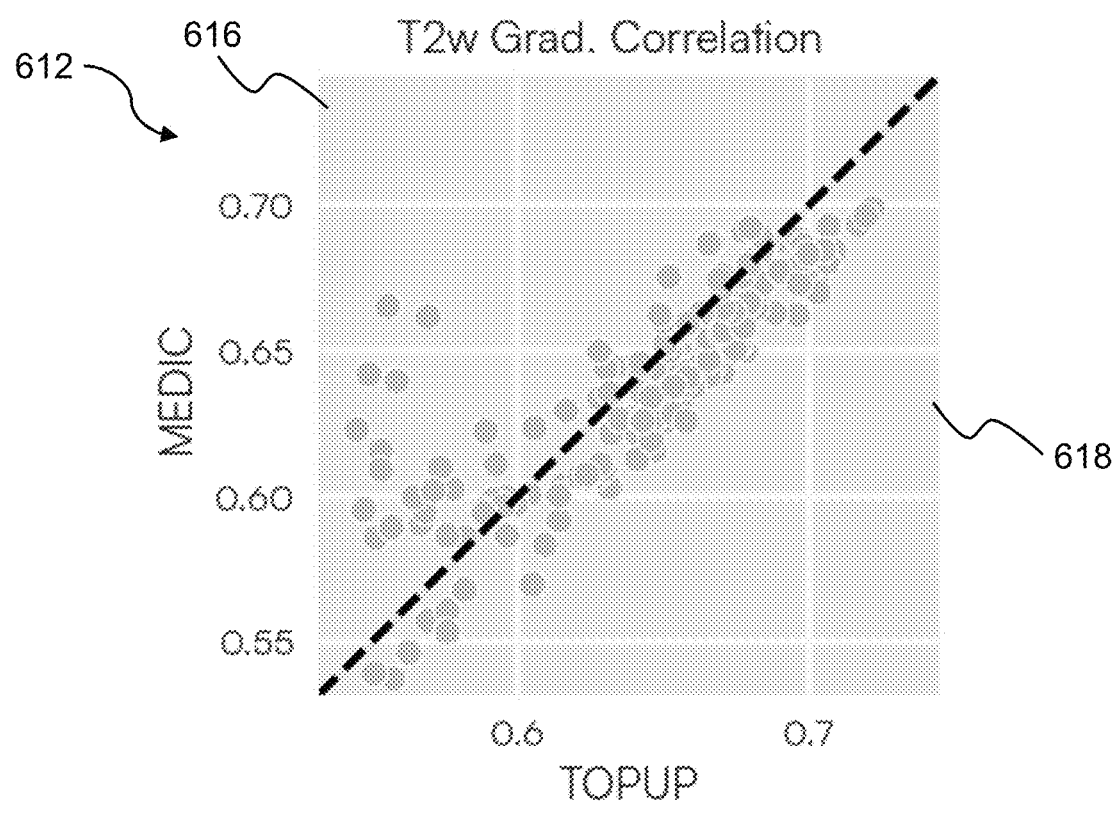
FIG. 6G is a plot illustrating a T2w gradient magnitude correlation for anatomical alignment metrics comparing MEDIC and TOPUP distortion correction methods.
FIG. 6H is a plot illustrating a T2w normalized mutual information for anatomical alignment metrics comparing MEDIC and TOPUP distortion correction methods.

FIGS. 6A to 6L illustrate anatomical alignment metrics comparing MEDIC and TOPUP distortion correction methods. FIG. 6A illustrates plot 600 for a T1w R2 spotlight metric. FIG. 6B illustrates plot 602 for a T1w R2 metric. FIG. 6C illustrates plot 604 for T1w gradient correlation. FIG. 6D illustrates plot 606 for a T1w normalized mutual information (NMI) metric. FIG. 6E illustrates plot 608 for a T2w R2 spotlight metric. FIG. 6F illustrates plot 610 for a T2w R2 metric. FIG. 6G illustrates plot 612 for T2w gradient correlation. FIG. 6H illustrates plot 614 for a T2w NMI metric.

Distortion corrected functional images from each distortion correction method were compared against each T1w/T2w anatomical image for each alignment measure, where bar plots (e.g., plots 600-614) for each metric were generated. Each bar plot (e.g., each of plots 600-614) represents the distribution of each anatomical alignment metric on each scan of the Adolescent dataset (N=185). Orange bars 616 indicate data corrected with MEDIC, while blue bars 618 indicate data corrected with TOPUP. Bolded labels indicate that the alignment metric was statistically significant in favor of the method (shown in FIGS. 6A, 6D). Spatial mean R2 of local spotlight metric for both T1w and T2w images (see also FIGS. 5A, 5B). Higher values indicate that a scan had, on average, higher local similarity to the anatomical images. Global alignment metrics such as (shown in FIGS. 6B, 6F) R2, (shown in FIGS. 6C, 6G) correlation of the gradient magnitude, and (shown in FIGS. 6D, 6H) normalized mutual information assess global correspondence of the distortion corrected functional data to T1w and T2w anatomical images. Higher values indicate greater global image similarity to the anatomical image.

To assess global image correspondence, multiple global metrics such as the squared correlation (R2), correlation of the gradient magnitude, and normalized mutual information (NMI) between each distortion corrected functional image and each T1w and T2w anatomical image were used, such as shown in FIGS. 6A-6H (see for example FIG. 6B). MEDIC significantly outperformed TOPUP on both T1w R2 (MEDIC =0.063 (SD: 0.028); TOPUP=0.060 (SD: 0.028); two-tailed paired t=11.284; p<0.001; df=184) and T2w R2 (MEDIC=0.457 (SD: 0.053); TOPUP=0.454 (SD: 0.056); two-tailed paired t=2.729; p=0.007; df=184) metrics, as well as the T1w gradient correlation (MEDIC=0.43 (SD: 0.028); TOPUP=0.414 (SD: 0.036); two-tailed paired t=11.727; p <0.001; df=184) metric. TOPUP slightly outperformed MEDIC on the T2w NMI (MEDIC=0.836 (SD: 0.026); TOPUP=0.838 (SD: 0.026); two-tailed paired t=−1.985; p=0.049; df=184) metric.

Alignment along specific tissue boundaries, delineated by the participant's anatomical segmentation was also examined. By overlaying the participant's anatomical segmentation on the time-average fMRI data, and computing the Receiver Operating Characteristic (ROC) curve, how well each distortion correction method correctly delineated tissue types along specific boundaries by computing the area under the curve (AUC) value was determined, as shown in FIGS. 6A-6H (see for example FIG. 6C). MEDIC significantly outperformed TOPUP correction in both the brain/exterior (MEDIC =0.735 (SD: 0.035); TOPUP=0.729 (SD: 0.034); two-tailed paired t=11.488; p<0.001; df=184) the gray/white matter (MEDIC=0.735 (SD: 0.035); TOPUP=0.729 (SD: 0.034); two-tailed paired t=11.488; p<0.001; df=184), and cerebellum/exterior (MEDIC=0.607 (SD: 0.041); TOPUP=0.596 (SD: 0.049); two-tailed paired t=5.073; p<0.001; df=184) boundaries.

Figures 6I, 6J:
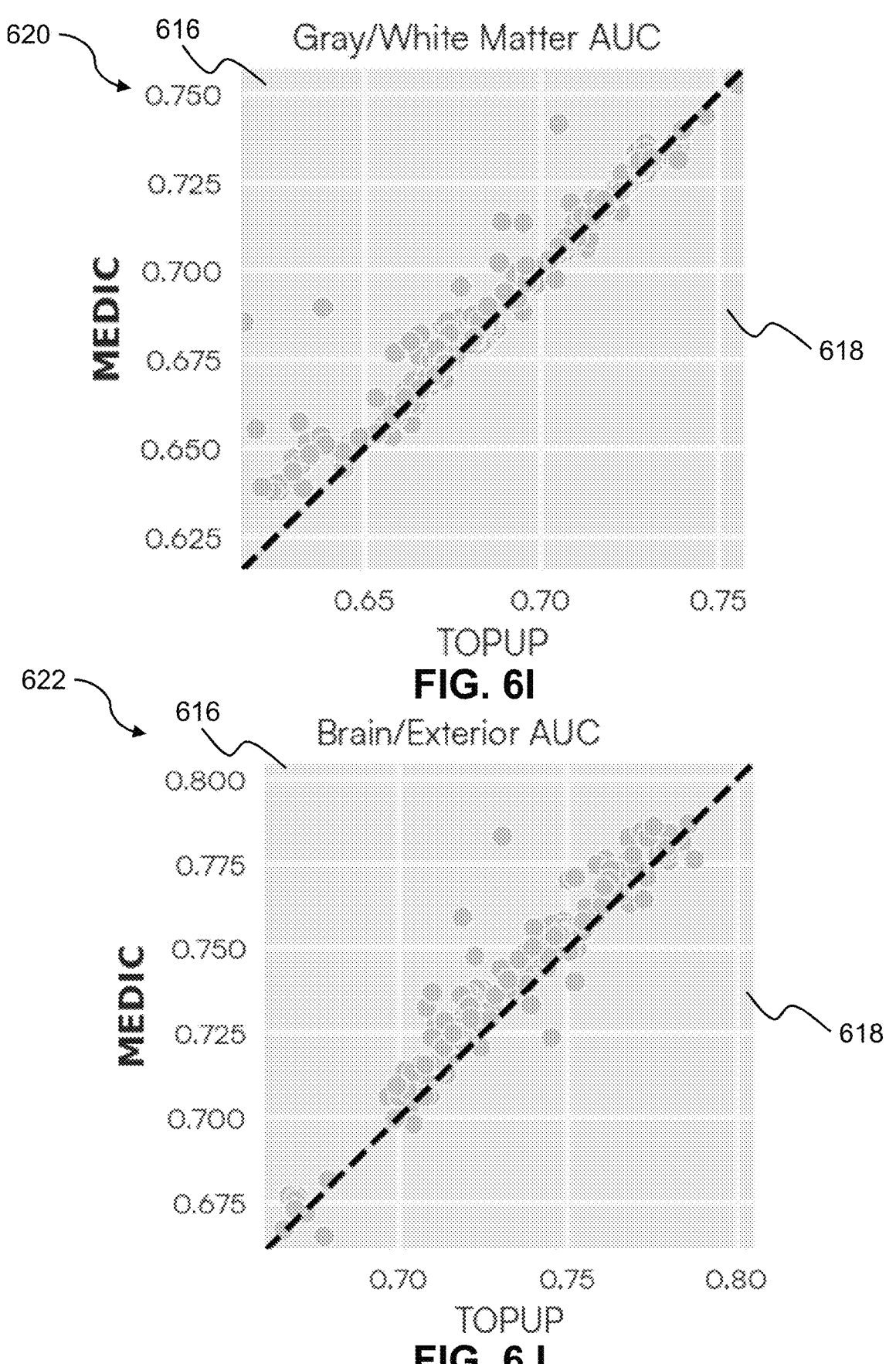
FIG. 6I is a plot illustrating gray/white matter area under the curve (AUC) segmentation metrics.
FIG. 6J is a plot illustrating brain/exterior AUC segmentation metrics.
Figures 6K, 6L:
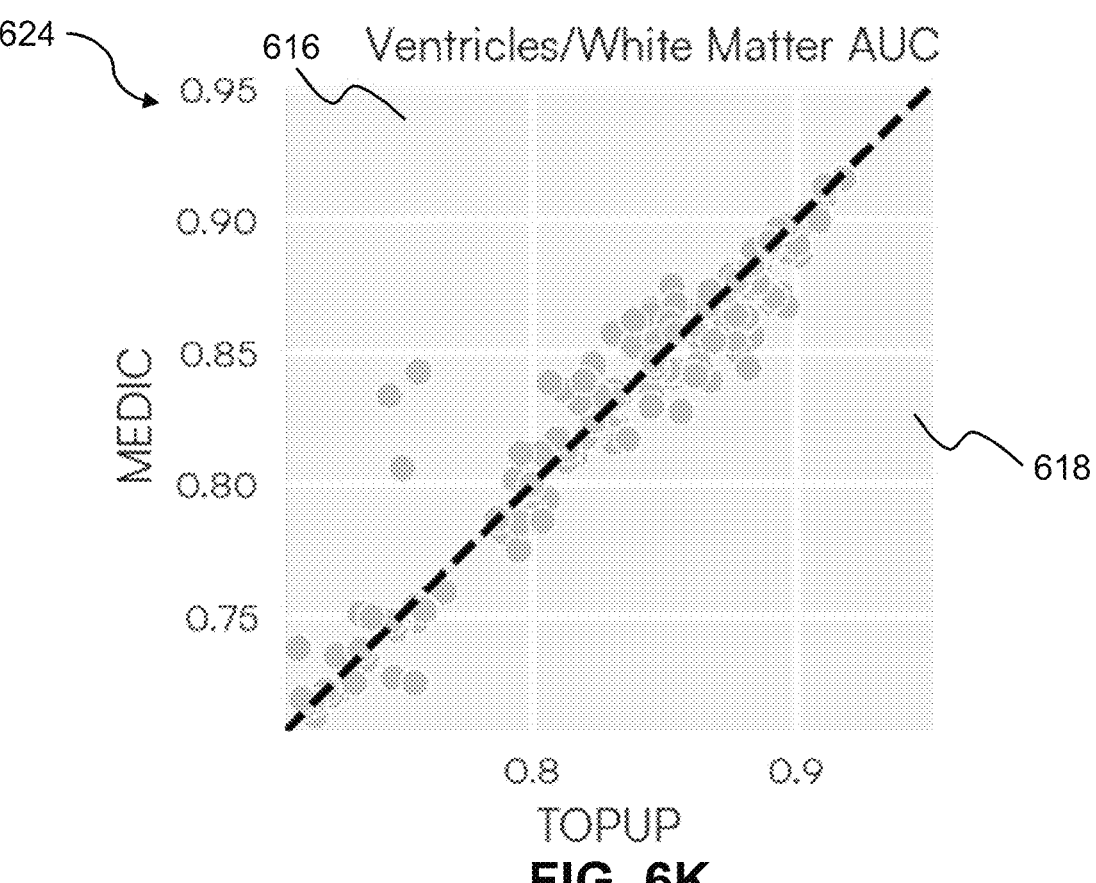
FIG. 6K is a plot illustrating ventricles/white matter AUC segmentation metrics.
FIG. 6L is a plot illustrating cerebellum/exterior AUC segmentation metrics.

FIGS. 6I, 6J, 6K, 6L illustrates plots for segmentation metrics assessing accuracy of software-based (e.g., Free-surfer-based) tissue segmentation on each functional image. FIG. 6I is a plot 620 illustrating gray/white matter area under the curve (AUC) segmentation metrics. FIG. 6J is a plot 622 illustrating brain/exterior AUC segmentation metrics. FIG. 6K is a plot 624 illustrating ventricles/white matter AUC segmentation metrics. FIG. 6L is a plot 626 illustrating cerebellum/exterior AUC segmentation metrics. Higher AUC values indicate that the anatomical segmentation was able to better discriminate between tissue types.

Methods

Multi-Echo DIstortion Correction (MEDIC)

To obtain field maps at each frame of a ME-fMRI acquisition, phase at multiple echo times must be measured. The field map is the slope of the relationship between phase and echo time. Therefore, at a minimum, at least two echoes are needed to compute the phase accumulation over time, e.g., the field map.

Computing the field map is complicated by several factors. First, the phase measured at each echo time contains a constant offset, such that the phase at zero echo time is not zero. This is a result of the coil combination process during reconstruction of the phase images, which can result in a phase offset. The second is the wrapping of the phase measurements, which bounds the domain of the measured phase between $[-\pi, \pi]$. This is a result of the phase being a periodic function and is a common problem when measuring a signal's phase information. Finally, the measured field map obtained from an ME-fMRI image is in the space of the distorted image, and must be transformed to the undistorted space to be used for distortion correction.

The Wrapped Phase Difference Problem

Consider a single frame of ME-fMRI data, where n echoes of phase and magnitude data are acquired at different echo times $t_1, t_2, \ldots, t_n$. Using the phase difference method, the phase information of the ME-EPI data can be related to the B0 field inhomogeneity based on a plurality of quantities including but not limited to phase, time, echo, location, position, magnitude, wrapping, voxel, weighting, and/or magnetic field homogeneity quantities, such as by the following equations:

$$\Delta\phi = \gamma \Delta B_0 \Delta t \tag{1}$$

where $\Delta\phi$ is the phase difference between two echoes, $\gamma$ is the gyromagnetic ratio, ABO is the B0 field inhomogeneity, and t is the echo time difference. For brevity, the field map is denoted as f, which is defined as $f=\gamma\Delta B0$. When images acquired from more than two echoes are available, Equation 1 generalizes to:

$$\begin{bmatrix} \phi_1(\vec{r}) \\ \phi_2(\vec{r}) \\ \vdots \\ \phi_n(\vec{r}) \end{bmatrix} = f(\vec{r}) \begin{bmatrix} t_1 \\ t_2 \\ \vdots \\ t_n \end{bmatrix} \tag{2}$$

where $\vec{r}$ is the spatial location for a given voxel, and n denotes the number of echoes in the data. Solving Equation 2 for f amounts to solving N linear systems, where N is the number of voxels in the image.

In practice, solving Equation 2 is complicated by two additional effects. The first is that phase information acquired from the scanner is wrapped, such that phase values beyond the range of $[-\pi, \pi]$, are wrapped back into the other side of the interval. Second, Equation 2 assumes that the phase accumulation at t=0 is zero, a fact which, depending on the specifics of the coil-combine algorithm applied to the phase data, is often not the case. The full model accounting for both of these effects is given by:

$$\begin{bmatrix} (\Omega(\phi_1(\vec{r})))^u \\ (\Omega(\phi_2(\vec{r})))^u \\ \vdots \\ (\Omega(\phi_n(\vec{r})))^u \end{bmatrix} = f(\vec{r}) \begin{bmatrix} t_1 \\ t_2 \\ \vdots \\ t_n \end{bmatrix} + \phi_0(\vec{r}) \tag{3}$$

where $\Omega$ is a wrapping operator that, such that $$\phi_n^{wrapped} = \Omega(\phi_n),$$

the wrapped phase, and $(\bullet)^u$ is an unwrapping operator, such that $$\phi_n(\Omega(\phi_n))^u = \phi_n^{wrapped} + 2\pi k$$

for some integer k, and $\phi_0$ is the phase accumulation at t=0. Note that the wrapped phase $$\phi_n^{wrapped}$$

is what is measured off the scanner. With the addition of phase wrapping and offset effects, Equation 3 is no longer a simple linear system when trying to solve for f.

Phase Offset Correction and Unwrapping

Estimation and removal of the phase offset is accomplished using the MCPC-3D-S algorithm. MCPC-3D-S estimates the phase offset by computing the unwrapped phase difference between the first and second echoes of the data, then estimating the phase offset by assuming linear phase accumulation between the first and second echoes. This is given by the following:

$$\phi_0(\vec{r}) = \Omega(\phi_1(\vec{r})) - \left(\frac{t_1}{t_2 - t_1}\right)(\Omega(\phi_2(\vec{r})) - \Omega(\phi_1(\vec{r})))^u \bmod 2\pi \quad (4)$$

In the case of MCPC-3D-S, the ROMEO unwrapping algorithm is used to unwrap $(\Omega(\phi_2(\vec{r})) - \Omega(\phi_1(\vec{r})))$.

Once $\phi_0$ is computed, the effects of the phase offset can be removed from Equation 3 by subtracting $\phi_0$ from the phase at each echo time.

Phase unwrapping is performed using the ROMEO algorithm. Phase information at later echoes tend to suffer from phase wrapping more than phase information at earlier echoes due to larger amounts of phase accumulation. This can degrade the performance of phase unwrapping algorithms that only consider the phase unwrapping problem at each echo time independently. ROMEO is able to constrain the unwrapping solution across all echoes by modeling the linear phase accumulation across echoes. This provides more accurate phase unwrapping solutions over other phase unwrapping methods, but requires the removal of phase offsets prior to unwrapping.

Temporal Phase Correction

Once the phases of all frames in a single ME-fMRI scan are unwrapped. A temporal correction step is applied to ensure phase unwrapping consistency across frames. For each frame, the phase of the first echo is considered against every other frame in an ME-fMRI scan that has a similar correlation with their corresponding magnitude image. Within a group of frames with a correlational similarity of 0.98 or greater, the phase values are corrected by adding/ subtracting the nearest $2\pi$ multiple that minimizes the difference to the mean phase value of the group, given by:

$$\phi_{m,1}^{offset}(\vec{r}) = 2\pi \cdot \left\lfloor \frac{\overline{\phi_{m,1}}(\vec{r}) - \phi_{m,1}}{2\pi} \right\rceil \quad (5)$$

where m denotes the frame index of the EPI time series, $\lfloor \rceil$ denotes the rounding operator, and $\overline{\phi_{m,1}}(\vec{r})$ is the mean phase value for the grouped first echo frames similar to frame m. Temporal phase correction for subsequent echoes is performed by linearly projecting the expected phase values beyond the previous echoes:

$$\phi_{m,n}^{offset}(\vec{r}) = 2\pi \cdot \left\lfloor \frac{1}{2\pi} \cdot \left(\phi_{m,n}(\vec{r}) - t_n \cdot \sum_{i=1}^{n-1} \frac{\phi_{m,i}(\vec{r})t_i}{\sum_{j=1}^{n-1} t_j^2}\right) \right\rceil \quad (6)$$

where n denotes the index of any echo after the first echo, and t is the echo time for the associated echo.

Weighted Field Map Computation

Field map estimation is accomplished with a weighted linear regression model. Since signal decay increases with echo time, SNR at later echoes tends to be lower than at earlier echoes, especially in areas of high susceptibility. To reduce the influence of voxels with low signal on the field map estimation, there is weighting by the squared magnitude of the signal at each echo time. Solving for Equation 2 then becomes a weighted least squares problem:

$$W\phi(\vec{r}) = Wf(\vec{r})t \quad (7)$$

where W is a diagonal weight matrix containing the magnitude of the signal at each echo time, $\phi(\vec{r})$ is the vector of phase values at each echo time for each voxel, and t is the vector of echo times. Equation 7 is computed for each frame to yield a field map time series corresponding to each frame of the ME-fMRI time series.

Low Rank Approximation

To reduce the effects of temporal noise components in the field maps, a low rank approximation approach was employed. This step is vital for removing large field changes along the borders of the brain, which tend to contain spurious changes in the field map due to a lack of signal or high measurement noise. The low rank approximation problem can be formulated as follows:

$$\min_{\hat{f}} \|f - \hat{f}\|_2 \quad (8)$$

$$\text{subject to } \text{rank}(\hat{f}) \le n$$

where f is the field map time series, reshaped as an N×T matrix (where N is the voxel dimension and T is the time dimension), $\hat{f}$ is the low rank approximation of f, and n is the rank of the approximation. The solution to Equation 8 is given by the Eckart-Young-Mirsky theorem, which is simply the n-truncated singular value decomposition of f:

$$\hat{f} = U\sum_{n} V^T \qquad (9)$$

where U and V are the left and right singular vectors of f, respectively, and $\Sigma n$ is the diagonal matrix of the first n singular values of f. For the solution estimated from Equation 9 in the present results, n=10 was used.

Displacement Field Inversion

Finally, to obtain the final field map in the undistorted space, each frame of the field map time series is converted to a displacement field using the readout time and voxel size of the data. This displacement field is then inverted to the nearest diffeomorphic inverse to obtain the final field map in the undistorted space. Displacement field inversion was performed using the InvertDisplacementFieldImageFilter of the ITK library.

Data Acquisition

Head Motion Dataset

Head motion data was collected on a single adult participant to assess MEDIC's capability in measuring and correcting B0 field changes due to head movement. Participant was asked to rotate their head along each cardinal axis of the scanner, while 3 TOPUP spin-echo field maps (TR: 8 s, TE: 66 ms, 72 Slices, FOV: 110×110, Voxel Size: 2.0 mm) pairs and magnitude/phase ME-fMRI data (TR: 1.761 s, TEs: 14.2, 38.93, 63.66, 88.39, 113.12 ms, 72 Slices, FOV: 110×110, Voxel Size: 2.0 mm, Multi-Band: 6, iPAT: 2) were collected using an MRI scanner such as a 3T whole-body scanner (Prisma, Siemens Healthcare). For each rotated head position, ~3 minutes of ME-fMRI data was collected. To serve as a reference for highly precise resting-state functional connectivity data, ~150 minutes of additional ME-fMRI data was collected over 4 scanning sessions. For anatomical images, T1w (Multi-echo MPRAGE, TR: 2.5 s, TEs: 1.81, 3.6, 5.39, 7.18 ms, 208 Slices, FOV: 300×300, Voxel Size: 0.8 mm, Bandwidth: 745 Hz/px) and T2w (T2 SPACE, TR: 3.2, TE: 565 ms, 176 Slices, Turbo Factor: 190, FOV: 256×256, Voxel Size: 1 mm, Bandwidth: 240 Hz/px) were collected.

First (e.g., Adolescent) Dataset

A dataset with 21 participants was acquired to assess MEDIC's distortion correction performance on a group level (ages: 9-12; 8M, 13F; 15 Control, 1 ASD, 6 ADHD). TOPUP spin-echo field maps (TR: 8 s, TE: 66 ms, 72 Slices, FOV: 110×110, Voxel Size: 2.0 mm) and magnitude/phase ME-fMRI data (TR: 1.761 s, TEs: 14.2, 38.93, 63.66, 88.39, 113.12 ms, 72 Slices, FOV: 110×110, Voxel Size: 2.0 mm, Multi-Band: 6, iPAT: 2) was collected using an MRI scanner such as a 3T whole-body scanner (Prisma, Siemens Healthcare). For each participant, three scans of ME-fMRI data were collected (2×~16 minutes, 1×~10 minutes) across 2-5 sessions. For anatomical images, T1w (MPRAGE, TR: 2.5 s, TEs: 2.9 ms, 176 Slices, FOV: 256×256, Voxel Size: 1.0 mm, Bandwidth: 240 Hz/px) and T2w (T2 SPACE, TR: 3.2, TE: 565 ms, 176 Slices, Turbo Factor: 200, FOV: 256×256, Voxel Size: 1 mm, Bandwidth: 4882 Hz/px) images were also collected. Real time motion monitoring was used during all acquisitions.

Second Dataset

A single adult participant (age: 25) with TOPUP spin-echo field maps (TR: 8 s, TE: 66 ms, 72 Slices, FOV: 110×110, Voxel Size: 2.0 mm) and magnitude/phase ME-fMRI data (TR: 1.761 s, TEs: 14.2, 38.93, 63.66, 88.39, 113.12 ms, 72 Slices, FOV: 110×110, Voxel Size: 2.0 mm, Multi-Band: 6, iPAT: 2) was collected using an MRI scanner such as a 3T whole-body scanner (Prisma, Siemens Healthcare). ME-fMRI data was collected over 4 sessions, with a total of ~174 minutes of resting-state data acquired. For anatomical images, T1w (MPRAGE, TR: 2.5 s, TEs: 2.9 ms, 176 Slices, FOV: 256×256, Voxel Size: 1.0 mm, Bandwidth: 240 Hz/px) and T2w (T2 SPACE, TR: 3.2, TE: 565 ms, 176 Slices, Turbo Factor: 190, FOV: 256×256, Voxel Size: 1 mm, Bandwidth: 240 Hz/px) were collected.

Third Dataset

A single adult participant (age: 30) with TOPUP spin-echo field maps (TR: 8 s, TE: 66 ms, 72 Slices, FOV: 110×110, Voxel Size: 2.0 mm) and magnitude/phase ME-fMRI data (TR: 1.761 s, TEs: 14.2, 38.93, 63.66, 88.39, 113.12 ms, 72 Slices, FOV: 110×110, Voxel Size: 2.0 mm, Multi-Band: 6, iPAT: 2) was collected using an MRI scanner such as a 3T whole-body scanner (Prisma, Siemens Healthcare). Two ~6 minute scans of resting-stage ME-fMRI data was collected. For anatomical images only a T1w (MPRAGE, TR: 2.5 s, TEs: 2.9 ms, 176 Slices, FOV: 256×256, Voxel Size: 1.0 mm, Bandwidth: 240 Hz/px) image was collected.

Abcd Dataset

A large-scale group averaged resting-state functional connectivity map from the Adolescent Brain Cognitive Development (ABCD) study was used to compare individual functional connectivity to averaged group data. This group average map used strict denoising (N=3,928; >8 min; RSFC data post frame censoring at a filtered frame-wise displacement <0.08 mm) to remove the effects of nuisance variables such as head motion and respiration. During ABCD data preprocessing, FSL TOPUP was used for distortion correction.

Processing Pipeline

MEDIC's dynamic distortion correction to the gold-standard of static distortion correction, FSL TOPUP was compared. For all comparisons, a common pipeline was used where all processing steps were kept the same, with the exception of the distortion correction method. For the MEDIC pipeline, field maps were computed and corrected for each frame of the ME-fMRI data using MEDIC. For the TOPUP pipeline, field maps were processed using FSL TOPUP, then coregistered to the ME-fMRI data using 4dfp tools. The same field map was then applied to each frame of the ME-fMRI for distortion correction. Note that for the low motion dataset, only TOPUP correction was used as a distortion correction method during preprocessing.

Both T1w and T2w anatomical data were processed by debiasing using FSL FAST before passing into software (e.g., Freesurfer) for anatomical segmentation. Anatomical data was then aligned to the MNI152 atlas using 4dfp tools. For ME-fMRI data, slice time correction and motion correction using 4dfp tools. Bias field correction of the ME-fMRI data was performed using N4 Bias field correction. Coregistration of the functional data to the anatomical data via the T2w image was performed using 4dfp tools. The final atlas aligned functional data was computed using a one-step resampling of the concatenated transforms (motion correction, distortion correction, functional to anatomical coregistration, anatomical to atlas coregistration) using FSL applywarp. The ME-fMRI data was combined into an optimally weighted combined image prior to nuisance regression and mapping to the surface using Connectome Workbench. Frame censoring was applied to remove the effects of head motion using a FD threshold of 0.08 after filtering for respiration.

Supplemental Information

Rigid-Body Alignment Parameters for Head Motion Data

FIG. 7A is a chart 700, where chart 700 lists average (e.g., standard deviation) of alignment parameters for each head position. Chart 700 lists the task (e.g., neutral, rotate +z, rotate −z, rotate +x, rotate −x, rotate +y, rotate −y) and alignment parameters including rx (deg), ry (deg), rz (deg), tx (mm), ty (mm), and tz (mm).

Anatomical Alignment Metrics Comparing MEDIC and TOPUP Distortion Correction Methods FIG. 7B is a chart 750, where chart 750 lists alignment metrics for MEDIC vs. TOPUP. Chart 750 lists metrics for each MEDIC and TOPUP, and that correspond, for example, with those in FIGS. 6A-6L, including: T1w R2 spotlight; T1w R2; T1w gradient correlation; T1w normalized mutual information (NMI); T2w R2 spotlight; T2w R2; T2w gradient correlation; T2w normalized mutual information (NMI); gray/white matter AUC; brain/exterior AUC; ventricles/white matter AUC; and cerebellum/exterior AUC. Chart 750 also lists-statistic, p-value, and df metrics.

TOPUP Field Map for High Motion Data

Figure 8:
FIG. 8 is a diagram illustrating a TOPUP field map for high motion data.
Figure 8:
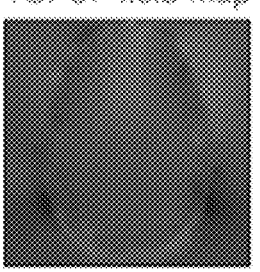
Figure 8:
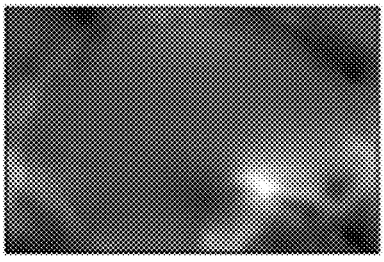
Figure 8:
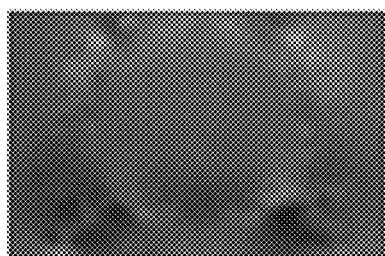

FIG. 8 illustrates a TOPUP field map 800 for high motion data. Spin-echo field maps (TR: 8 s, TE: 66 ms, 72 Slices, FOV: 110×110, Voxel Size: 2.0 mm) were collected prior to high motion data collection to simulate a typical acquisition of a field map. Field map data was acquired when the head was in the neutral position. Scans were subsequently passed into TOPUP for B0 field estimation using TOPUP's default settings. The same field map was applied to all frames for correction, regardless of head position, after motion correction to a reference frame.

MEDIC Field Maps can Measure Respiration Induced B0 Field Changes

One well known phenomenon is the effect of respiration on the B0 field. As the participant inhales and exhales, the shifting of organs within the thoracic and abdominal regions, coupled with alterations in the oxygenation levels of the breathed in gas, leads to global oscillations in the B0 field. These global oscillations, through dynamic field mapping, can be measured by MEDIC field maps. One aim was to examine whether respiration could be measured solely with a MEDIC dynamic field map, through averaging of all voxels in the field map and high pass filtering the resultant signal (4th order butterworth, 0.15 Hz cutoff frequency) to obtain an estimation of the participant's respiration signal.

Figure 9A:
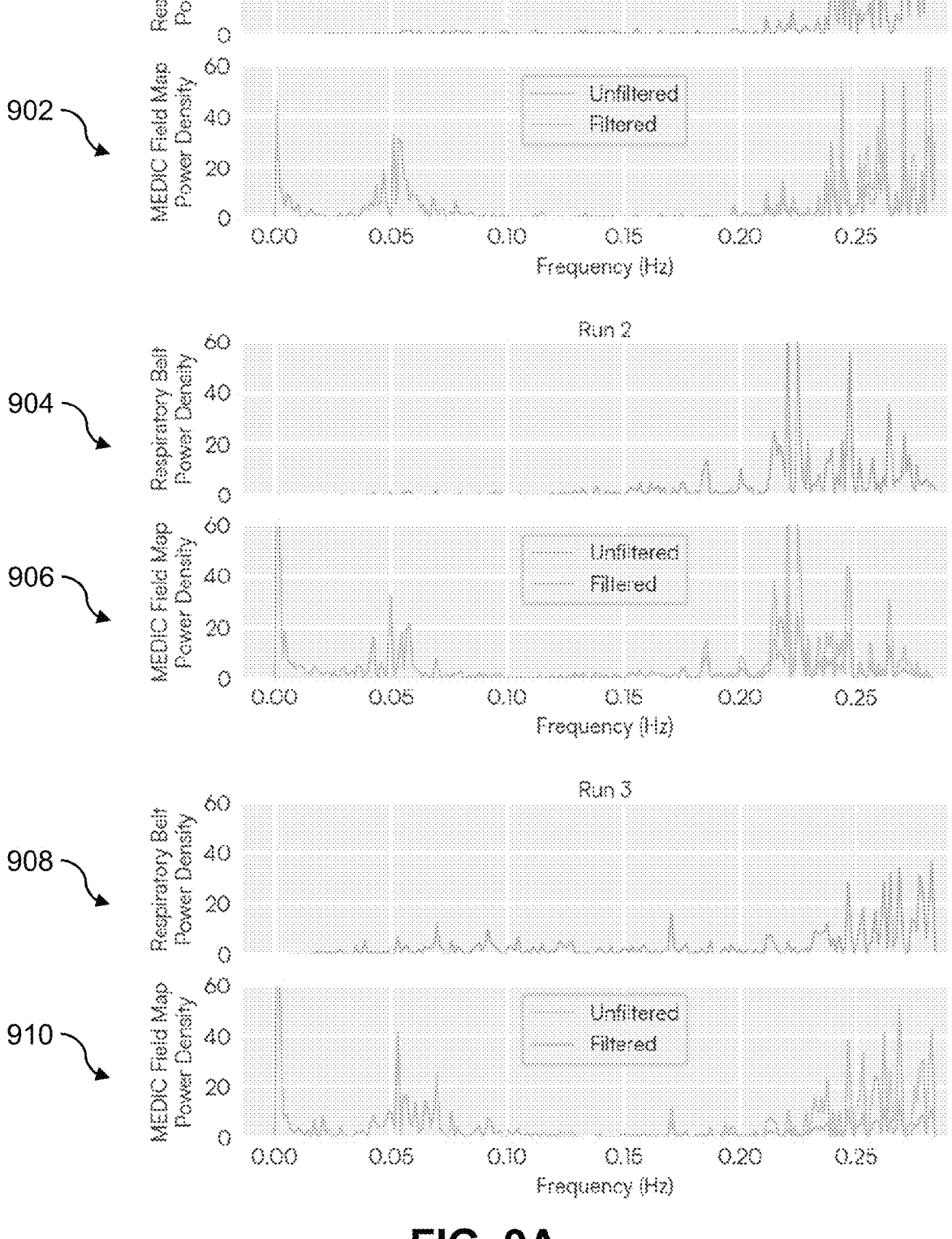
FIG. 9A is a diagram illustrating a power spectral density of signal from respiratory belt and MEDIC field maps.
Figure 9B:
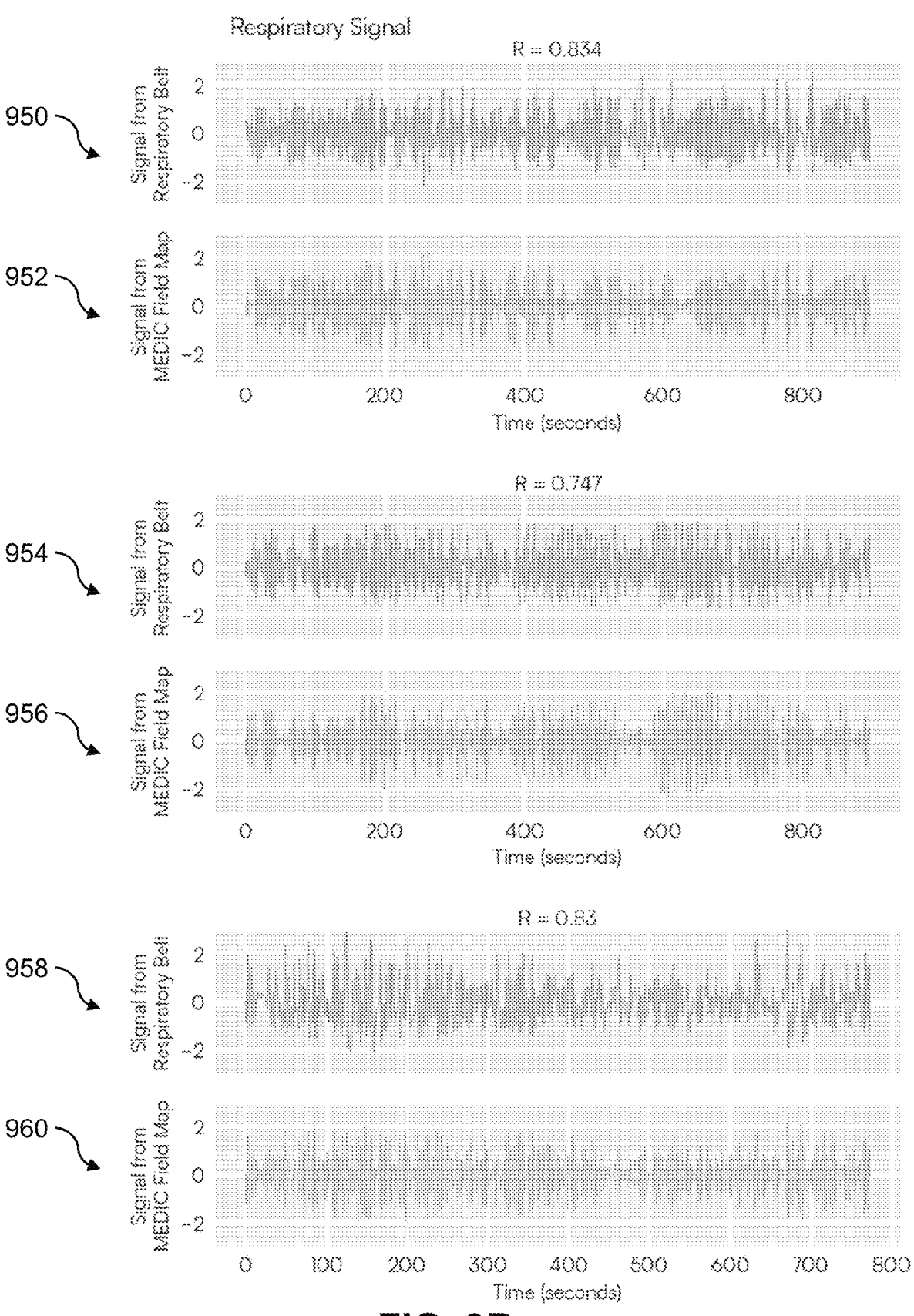
FIG. 9B is a diagram illustrating a signal from the respiratory belt and filtered signal from the MEDIC field across each run in accordance with FIG. 7A.

MEDIC field maps were computed for a single participant with three runs of ME-EPI data with corresponding respiration belt data for comparison, FIGS. 9A and 9B. MEDIC field maps contain spectral frequency content in the 0.2 Hz to 0.3 Hz band, which generally corresponds to frequencies associated with respiration (~12-20 breaths per minute). Filtering the MEDIC field map signal with a high pass filter (4th order butterworth, 0.15 Hz cutoff frequency) isolates these frequencies for comparison to the respiration signal acquired from the respiratory belt. This filtered signal has a high correlation to the respiratory belt signal across each run (Run 1: R=0.834; Run 2: R=0.747; Run 3: R=0.830) indicating successful extraction of the respiration signal from a MEDIC field map.

This capability offers a synchronized physiological monitoring feature that is inherently time-locked to imaging data. As a result, MEDIC can provide either a redundant or supplemental means of collecting respiration signals during scanning sessions. This is especially crucial given the complexities and challenges of capturing respiration data due to issues like respiratory belt clipping and/or malfunctions. Moreover, the respiration signal used in MEDIC field maps may be used to improve current data pre-processing and analysis methods, thereby enhancing data quality.

FIGS. 9A and 9B illustrate a comparison of respiration signal from respiratory belt against respiration signal extracted from MEDIC field maps across 3 runs of the same participant. All data was mean/standard deviation normalized before each analysis. FIG. 9A illustrates power spectral density of signal from respiratory belt and MEDIC field maps. FIG. 9A illustrates plots 900 and 902 for Run 1, plots 904 and 906 for Run 2, and plots 908 and 910 for RUN 3. Plots 900, 904, and 908 are respiratory belt plots. Plots 902, 906, and 910 are MEDIC field map plots. Red spectral plot indicates spectral frequency content collected from respiratory belt data from each run. Green and purple spectral plots indicate the frequency content from the average field map time series before and after filtering with a high pass filter for each run (butterworth filter; 4th order; cutoff frequency 0.15 Hz). FIG. 9B illustrates signals from the respiratory belt (red) and filtered signal (purple) from the MEDIC field across each run. FIG. 9B illustrates plots 950 and 952 for Run 1, plots 954 and 956 for Run 2, and plots 958 and 960 for RUN 3. Plots 950, 954, and 958 are signal from respiratory belt plots. Plots 952, 956, and 960 are signal from MEDIC field map plots. R values above each plot run indicates the correlation between the two signals.

Figure 10:
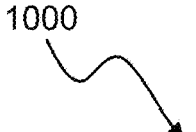
FIG. 10 is a process diagram of a method according to the present disclosure.

FIG. 10 illustrates a process diagram for a method 1000 for providing functional magnetic resonance imaging (MRI) distortion correction according to the present disclosure. Method 1000 includes receiving 1002 MRI data. Method 1000 further includes measuring 1004 a difference in the MRI data. Method 1000 further includes sampling 1006 distortion in the MRI data. Method 100 further includes estimating 1008 magnetic field inhomogeneity in the MRI data. Method 1000 further includes performing 1010 dynamic frame-wise distortion correction on the MRI data. Method 1000 further includes generating 1012 corrected data. Method 100 further includes generating 1014 field maps based on the corrected data.

In some embodiments, receiving 1002 includes receiving multi-echo functional MRI (ME-fMRI) data obtained from one or more MRI scanners configured to perform at least one magnetic resonance acquisition, the ME-fMRI data including phase information and time information associated with the at least one magnetic resonance acquisition. In some embodiments, measuring 1004 includes measuring at least one difference between two or more echoes of a plurality of echoes associated with the at least one magnetic resonance acquisition. In some embodiments, sampling 1006 includes sampling distortion across a plurality of image frames included in the ME-fMRI data, the distortion being a result of fluctuating magnetic field inhomogeneities associated with the two or more echoes. In some embodiments, estimating 1008 includes estimating, based on the sampled distortion, a frame-by-frame magnetic field inhomogeneity for each of the plurality of image frames. In some embodiments performing 1010 includes performing, based on each estimated frame-by-frame magnetic field inhomogeneity, dynamic frame-wise distortion correction for each of the plurality of image frames to generate corrected data. In some embodiments, generating 1014 includes generating one or more field maps based on the corrected data. One or more of steps 1002-1014 of method 1000 may include utilizing one or more of Equations 1-9 and/or the processing pipeline as described herein.

Figure 11:
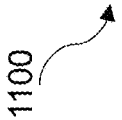
FIG. 11 is a schematic block diagram of an example system configuration according to the present disclosure.

In various aspects, the methods described herein may be implemented using an MRI system. FIG. 11 is an illustration of an MRI system 1100 in one aspect. As illustrated in FIG. 11, the MRI system 1100 may include an MRI scanner 1102 operatively coupled and/or in communication with a computer system 1104. In this aspect, the computer system 1104 is configured to receive data from the MRI scanner 1102, and is further configured to execute a plurality of stored executable instructions encoding one or more aspects of the MRI method as described herein above. In another aspect, the computer system 1104 may be further configured to operate the MRI scanner 1102 to obtain, for example, data by executing an additional plurality of stored executable instructions. The computer system 1104 may be located near the MRI scanner 1102 (e.g., in the same or an adjacent room) or may be remotely located from the MRI scanner (e.g., in a different building, a different city, a different country, etc.). Moreover, the computer system 1104 may include combinations of local and remote components, and may be or include a cloud computing system.

MRI scanner 1102 may include one or more processors 1106 and one or more memories 1108 operatively connected to the one or more processors 1106. MRI scanner 1102 may be configured and fully equipped for advanced (e.g., brain) imaging. In one embodiment, MRI scanner 1102 may include, for example, and without limitation: (i) a short-bore (2 m) magnet; (ii) a fast gradient system that provides high-speed structural and functional imaging; and (iii) a multi-channel (e.g., 64 channel) data acquisition system for parallel imaging, and may combine a maximum gradient amplitude of, for example, 80 mT/m with a 200 T/m/s slew rate, capable of driving higher SNR throughout all regions of the body. Such a gradient system is beneficial for imaging techniques such as EPI, described herein. Further regarding EPI, signal loss due to underlying B0 inhomogeneity may be significantly reduced by reducing the effective echo time and/or echo spacing. MRI scanner 1102 may be configured to use a parallel transmit system with two independent coils, such that a magnetic field can be homogenized by varying the relative phase between the two transmit coil elements. MRI scanner 1102 may include Radio Frequency (RF) transmit and receive system with digital-input and output systems that enhance signal quality by transmitting the RF signal over fiber optic cables, helping to eliminate electromagnetic crosstalk between different RF channels and interference from spurious RF sources, and improving SNR. Increased spatial and temporal SNR may also reduce total exam time, which may be beneficial for studies involving participants such as children to get higher-quality data in less time. Additionally, MRI scanner 1102 may include dedicated force compensation on each axis to realize low vibrations and low acoustic noise and high-performance cooling for each individual axis to allow full duty cycle over long-term measurements with outstanding stability. This may also be beneficial for participants such as children that may be sensitive to noise. MRI scanner 1102 may include one or more multi-channel RF head coils, including: a 64-channel coil, a 32-channel coil, and a 16-channel coil. As described herein, MRI scanner 1102 may be realized as a SIEMENS Prisma MRI scanner in some embodiments.

Computer system 1104 may include one or more processors 1110 for executing computer-readable instructions and one or more memories 1112 operatively connected to the one or more processors 1110. Computation can be further reduced by running MEDIC's algorithm, which may be configured as a parallel algorithm, on a computer with multiple cores. In this regard, each processor 1110 of system 1104 may be multi-core. Additionally, or alternatively, parallel processing may be implemented by one or more operatively connected systems 1104 in a distributed computing configuration.

In operation, MRI scanner 1102 may be configured to obtain MR images 1114 of a patient/participant 1116, including all underlying information and data 1118 associated with such MR images 1114. Computer system 1104 may be configured to obtain or otherwise receive MR images 1114 and corresponding information and data 1118 (e.g., ME-fMRI data) obtained from one or more MRI scanners 1102. As described herein, information and data 1118 may include ME-fMRI data, including information such as phase information and echo time information as described herein. MR images 1114 and information and data 1118, as well as corresponding calculated data as described herein, may be stored in a memory 1112.

Figure 12:
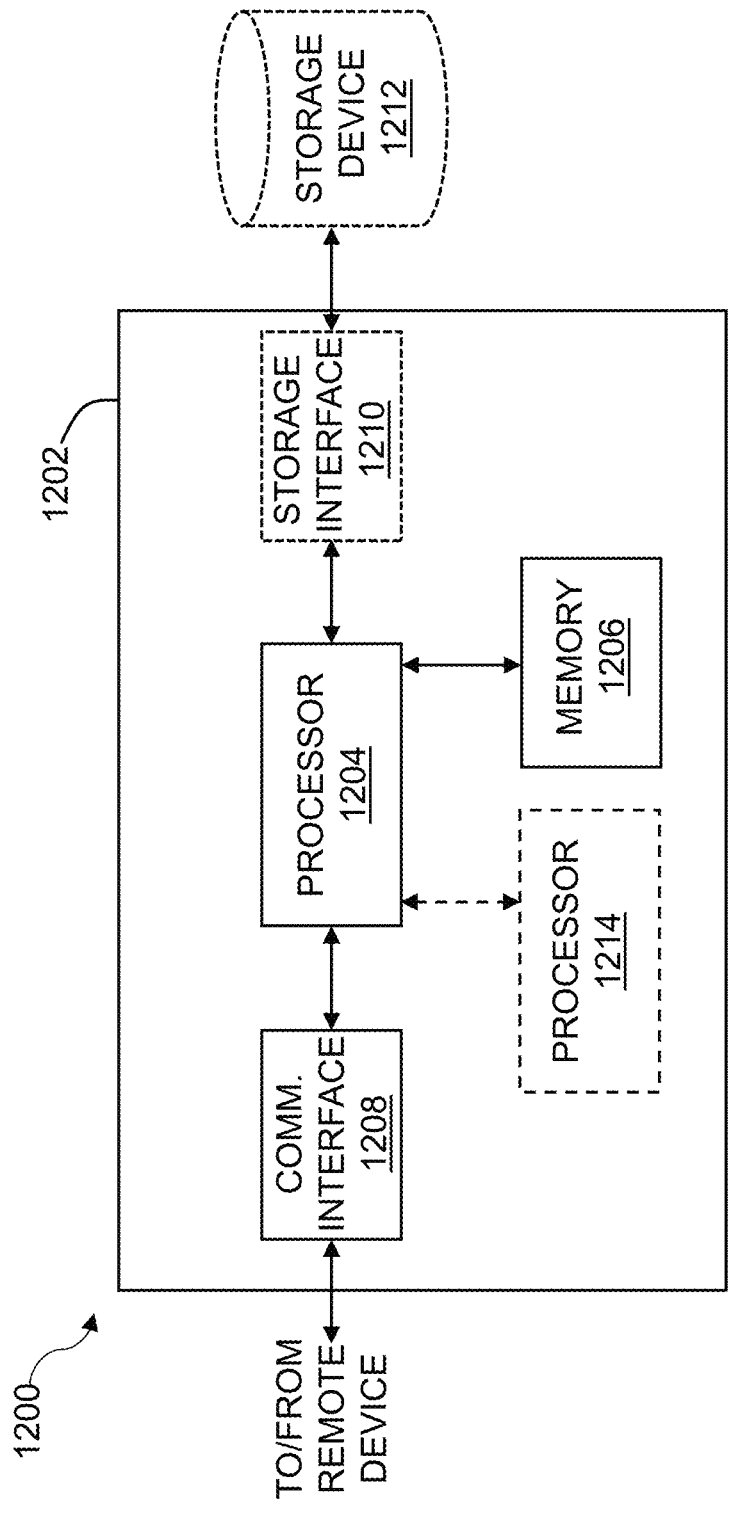
FIG. 12 is a schematic block diagram of an example server device according to the present disclosure.

In one embodiment, computer system 1104 may be configured as a server system. FIG. 12 illustrates an example configuration 1200 of a server system 1202 used to receive measurements from the MRI scanner 1102 (shown in FIG. 11). Server system 1202 may also include, but is not limited to, a database server. In this example embodiment, server system 1202 performs all of the steps used to implement the MRI imaging method as described herein above.

In this aspect, the server system 1202 includes a processor 1204 for executing instructions. Instructions may be stored in a memory area 1206, for example. The processor 1204 may include one or more processing units (e.g., in a multi-core configuration) for executing instructions. The instructions may be executed within a variety of different operating systems on the server system 1202, such as UNIX, LINUX, Microsoft Windows®, etc. It should also be appreciated that upon initiation of a computer-based method, various instructions may be executed during initialization. Some operations may be required in order to perform one or more processes described herein, while other operations may be more general and/or specific to a particular programming language (e.g., C, C#, C++, Java, or any other suitable programming languages).

The processor 1204 is operatively coupled to a communication interface 1208 such that server system 1202 is capable of communicating with a remote device, such as the MRI scanner 1102, a user system, or another server system 1202. For example, communication interface 1208 may receive requests (e.g., requests to provide an interactive user interface to receive sensor inputs and to control one or more devices of system 1100 from a client system via the Internet.

Processor 1204 may also be operatively coupled via a storage interface 1210 to a storage device 1212. Storage device 1212 is any computer-operated hardware suitable for storing and/or retrieving data. In some embodiments, storage device 1212 is integrated in server system 1202. For example, server system 1202 may include one or more hard disk drives as storage device 1212. In other embodiments, storage device 1212 is external to server system 1202 and may be accessed by a plurality of server systems 1202. For example, storage device 1212 may include multiple storage units such as hard disks or solid state disks in a redundant array of inexpensive disks (RAID) configuration. Storage device 1212 may include a storage area network (SAN) and/or a network attached storage (NAS) system. MR images 1114 and information and data 1118 shown in FIG. 11, as well as corresponding calculated data, may be stored in storage device 1212.

Storage interface 1210 is any component capable of providing processor 1204 with access to storage device 1212. Storage interface 1210 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 1204 with access to storage device 1212.

Memory area 1206 may include, but are not limited to, random access memory (RAM) such as dynamic RAM (DRAM) or static RAM (SRAM), read-only memory (ROM), erasable programmable read-only memory (EPROM), electrically erasable programmable read-only memory (EEPROM), non-volatile RAM (NVRAM), registers, hard disk memory, a removable disk, a CD-ROM, or any other form of computer-readable storage medium known in the art. The above memory types are exemplary only, and are thus not limiting as to the types of memory usable for storage of a computer program.

Computation can be further reduced by running MEDIC's algorithm, which may be configured as a parallel algorithm, on a computer with multiple cores. Additionally, or alternatively, parallel processing may be implemented by (i) one or more additional processors 1214, and/or (ii) one or more operatively connected systems 1202 in a distributed computing configuration. Each processor 1204/1214 of system 1202 may be multi-core.

Figure 13:
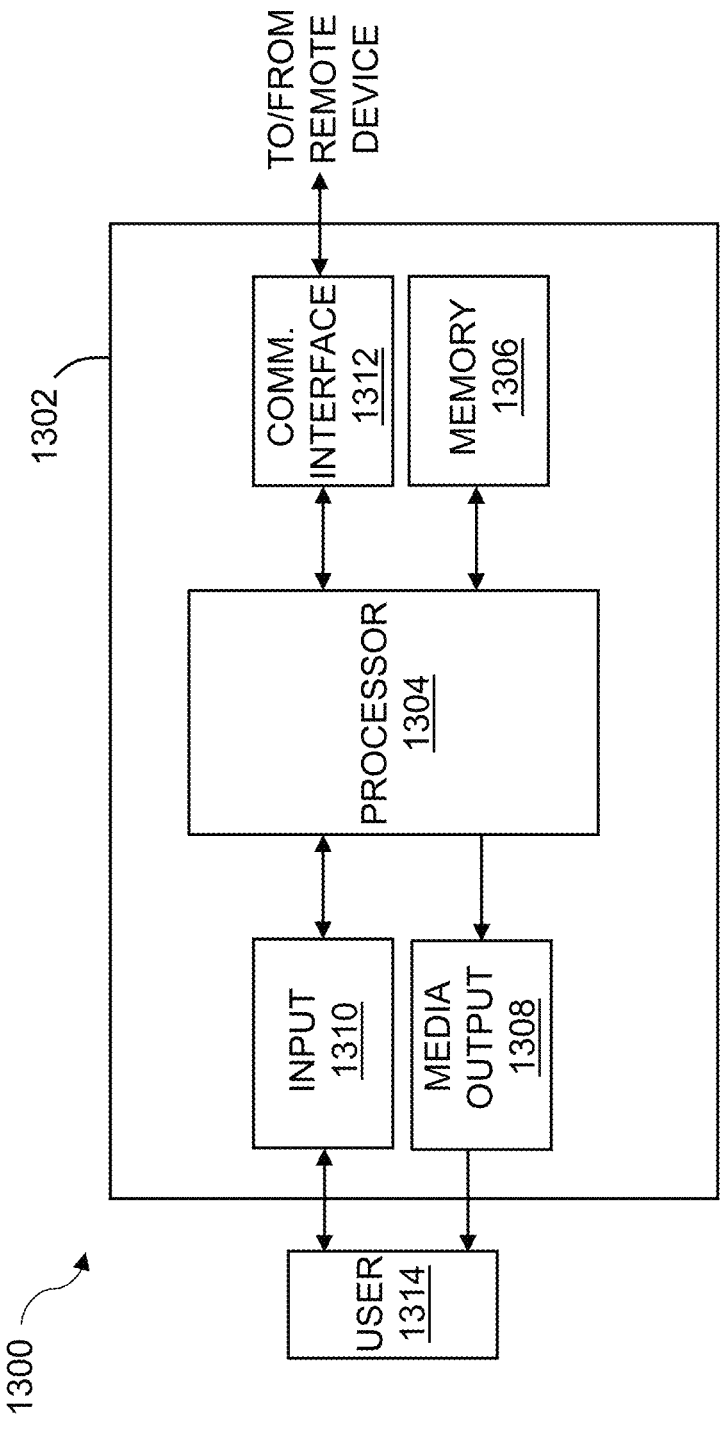
FIG. 13 is a schematic block diagram of an example computing device according to the present disclosure.

In another embodiment, computer system 1104 may be provided in the form of a computing device, such as a configuration 1300 of a computing device 1302 as shown in FIG. 13. Computing device 1302 includes a processor 1304 for executing instructions. In some embodiments, executable instructions are stored in a memory area 1306. Processor 1304 may include one or more processing units (e.g., in a multi-core configuration). Memory area 1306 is any device allowing information such as executable instructions and/or other data to be stored and retrieved. Memory area 1306 may include one or more computer-readable media.

In another embodiment, the memory included in the computing device 1302 may include a plurality of modules. Each module may include instructions configured to execute using at least one processor. The instructions contained in the plurality of modules may implement at least part of the method for simultaneously regulating a plurality of process parameters as described herein when executed by the one or more processors of the computing device. Non-limiting examples of modules stored in the memory of the computing device include: a first module to receive measurements from one or more sensors and a second module to control one or more devices of the MRI imaging system 1400.

Computing device 1302 also includes one media output component 1308 for presenting information to a user. Media output component 1308 is any component capable of conveying information to a user. In some embodiments, media output component 1308 includes an output adapter such as a video adapter and/or an audio adapter. An output adapter is operatively coupled to processor 1304 and is further configured to be operatively coupled to an output device such as a display device (e.g., a liquid crystal display (LCD), organic light emitting diode (OLED) display, cathode ray tube (CRT), or "electronic ink" display) or an audio output device (e.g., a speaker or headphones).

In some embodiments, client computing device 1302 includes an input device 1310 for receiving input from a user. Input device 1310 may include, for example, a keyboard, a pointing device, a mouse, a stylus, a touch sensitive panel (e.g., a touch pad or a touch screen), a camera, a gyroscope, an accelerometer, a position detector, and/or an audio input device. A single component such as a touch screen may function as both an output device of media output component 1308 and input device 1310.

Computing device 1302 may also include a communication interface 1312, which is configured to communicatively couple to a remote device such as server system or a web server. Communication interface 1312 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)). Such communication configurations and/or protocols may be implemented in the embodiments shown in and described in connection with FIGS. 11 and 12.

Media output component 1308 may be configured to present information to a user 1314, and input device 1310 may be configured to receive input from user 1314.

Stored in memory 1306 are, for example, computer-readable instructions for providing a user interface to user 1314 via media output component 1308 and, optionally, receiving and processing input from input device 1310. A user interface may include, among other possibilities, a web browser and an application. Web browsers enable users 1314 to display and interact with media and other information typically embedded on a web page or a website from a web server. An application allows users 1314 to interact with a server application.

Although the present disclosure is described in connection with an exemplary imaging system environment, embodiments of the invention are operational with numerous other general purpose or special purpose imaging system environments or configurations. The imaging system environment is not intended to suggest any limitation as to the scope of use or functionality of any aspect of the invention. Moreover, the imaging system environment should not be interpreted as having any dependency or requirement relating to any one or combination of components illustrated in the exemplary operating environment. Examples of well-known imaging systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Computer systems, as described herein, refer to any known computing device and computer system. As described herein, all such computer systems include a processor and a memory. However, any processor in a computer system referred to herein may also refer to one or more processors wherein the processor may be in one computing device or a plurality of computing devices acting in parallel. Additionally, any memory in a computer device referred to herein may also refer to one or more memories wherein the memories may be in one computing device or a plurality of computing devices acting in parallel. Each of the memories described herein (e.g., as shown in and described in connection with FIGS. 11-13) may be non-transitory storage mediums.

The term "processor," as used herein, refers to central processing units, microprocessors, microcontrollers, reduced instruction set circuits (RISC), application specific integrated circuits (ASIC), logic circuits, and any other circuit or processor capable of executing the functions described herein. The above are examples only, and are thus not intended to limit in any way the definition and/or meaning of the term "processor."

As used herein, the term "database" may refer to either a body of data, a relational database management system (RDBMS), or to both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, California; IBM is a registered trademark of International Business Machines Corporation, Armonk, New York; Microsoft is a registered trademark of Microsoft Corporation, Redmond, Washington; and Sybase is a registered trademark of Sybase, Dublin, California.)

In one embodiment, a computer program is provided to enable the data processing of the MRI method as described herein above, and this program is embodied on a computer readable medium. In an example embodiment, the computer system is executed on a single computer system, without requiring a connection to a server computer. In a further embodiment, the computer system is run in a Windows® environment (Windows is a registered trademark of Microsoft Corporation, Redmond, Washington). In yet another embodiment, the computer system is run on a mainframe environment and a UNIX® server environment (UNIX is a registered trademark of X/Open Company Limited located in Reading, Berkshire, United Kingdom). Alternatively, the computer system is run in any suitable operating system environment. The computer program is flexible and designed to run in various different environments without compromising any major functionality. In some embodiments, the computer system includes multiple components distributed among a plurality of computing devices. One or more components may be in the form of computer-executable instructions embodied in a computer-readable medium.

The computer systems and processes are not limited to the specific embodiments described herein. In addition, components of each computer system and each process can be practiced independent and separate from other components and processes described herein. Each component and process also can be used in combination with other assembly packages and processes.

Exemplary embodiments of methods, systems, and apparatus for use in frame-wise multi-echo distortion correction for fMRI are described above in detail. The methods, systems, and apparatus are not limited to the specific embodiments described herein but, rather, operations of the methods and/or components of the systems and/or apparatus may be utilized independently and separately from other operations and/or components described herein. Further, the described operations and/or components may also be defined in, or used in combination with, other systems, methods, and/or apparatus, and are not limited to practice with only the systems, methods, and apparatus described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

It will be understood by those of skill in the art that information and signals may be represented using any of a variety of different technologies and techniques. For example, data, instructions, commands, information, signals, bits, symbols, and/or chips may be represented by voltages, currents, electromagnetic waves, magnetic fields or particles, optical fields or particles, or any combination thereof. Similarly, the various illustrative logical blocks, modules, circuits, and algorithm operations described herein may be implemented as electronic hardware, computer software, or a combination of both, depending on the application and the functionality. Moreover, the various logical blocks, modules, and circuits described herein may be implemented or performed with a general purpose computer, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. Exemplary general purpose processors include, but are not limited to only including, microprocessors, conventional processors, controllers, microcontrollers, state machines, or a combination of computing devices.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer system for providing functional magnetic resonance imaging (MRI) distortion correction, the computer system including at least one processor in communication with at least one memory device, the at least one processor programmed to:

receive multi-echo functional MRI (ME-fMRI) data obtained from one or more MRI scanners configured to perform at least one magnetic resonance acquisition, the ME-fMRI data including phase information and time information associated with the at least one magnetic resonance acquisition;

measure at least one difference between two or more echoes of a plurality of echoes associated with the at least one magnetic resonance acquisition;

sample distortion across a plurality of image frames included in the ME-fMRI data, the distortion being a result of fluctuating magnetic field inhomogeneities associated with the two or more echoes;

estimate, based on the sampled distortion, a frame-by-frame magnetic field inhomogeneity for each of the plurality of image frames;

based on each estimated frame-by-frame magnetic field inhomogeneity, perform dynamic frame-wise distortion correction for each of the plurality of image frames to generate corrected data; and generate a respective field map for each image frame of the plurality of image frames based on the corrected data, wherein each respective field map is based on a respective field map time series corresponding to a respective ME-fMRI time series for the plurality of image frames.

2. A computer system in accordance with claim 1, wherein the at least one difference is a phase difference between the two or more echoes.

3. A computer system in accordance with claim 1, wherein the dynamic frame-wise distortion correction is performed without any acquiring any separate field maps other than the generated respective field maps.

4. A computer system in accordance with claim 1, wherein the at least one processor is further programmed to:

generate each respective field map based on a displacement field conversion for the corresponding field map time series.

5. A computer system in accordance with claim 1, wherein the at least one processor is further programmed to convert the phase information via at least one of phase unwrapping and linear fitting.

6. A computer system in accordance with claim 1, wherein the dynamic frame-wise distortion correction is configured to correct anatomical alignment inaccuracies in each of the plurality of image frames.

7. A computer system in accordance with claim 1, wherein the estimation of the frame-by-frame magnetic field homogeneity includes the at least one processor being programmed to estimate the frame-by-frame magnetic field inhomogeneity as a slope of a linear relationship between at least one phase and at least one echo time of the two or more echoes.

8. A computer system in accordance with claim 1, wherein the at least one processor is further programmed to perform low rank approximation to remove noise components in association with the generation of the one or more field maps.

9. A computer system in accordance with claim 1, wherein the at least one processor is further programmed to correct for off-resonance effects in association with the performance of the dynamic frame-wise distortion correction.

10. A computer system in accordance with claim 9, wherein the off-resonance effects include at least one of eddy currents and Maxwell gradients.

11. A computer-implemented method for providing functional magnetic resonance imaging (MRI) distortion correction using at least one processor in communication with at least one memory, the method comprising:

receiving multi-echo functional MRI (ME-fMRI) data obtained from one or more MRI scanners configured to perform at least one magnetic resonance acquisition, the ME-EMRI data including phase information and time information associated with the at least one magnetic resonance acquisition;

measuring at least one difference between two or more echoes of a plurality of echoes associated with the at least one magnetic resonance acquisition;

sampling distortion across a plurality of image frames included in the ME-fMRI data, the distortion being a result of fluctuating magnetic field inhomogeneities associated with the two or more echoes;

estimating, based on the sampled distortion, a frame-by-frame magnetic field inhomogeneity for each of the plurality of image frames;

based on each estimated frame-by-frame magnetic field inhomogeneity, performing dynamic frame-wise distortion correction for each of the plurality of image frames to generate corrected data; and generating a respective field map for each image frame of the plurality of image frames based on the corrected data, wherein each respective field map is based on a respective field map time series corresponding to a respective ME-fMRI time series for the plurality of image frames.

12. A computer-implemented method in accordance with claim 11, wherein the at least one difference is a phase difference between the two or more echoes.

13. A computer-implemented method in accordance with claim 11, further comprising generating each respective field map based on a displacement field conversion for the corresponding field map time series.

14. A computer-implemented method in accordance with claim 11, wherein the dynamic frame-wise distortion correction is configured to correct anatomical alignment inaccuracies in each of the plurality of image frames.

15. A computer-implemented method in accordance with claim 11, wherein the estimating of the frame-by-frame magnetic field homogeneity includes estimating the frame-by-frame magnetic field inhomogeneity as a slope of a linear relationship between at least one phase and at least one echo time of the two or more echoes.

16. One or more non-transitory computer-readable storage media for a computing system providing functional magnetic resonance imaging (MRI) distortion correction, the one or more non-transitory computer-readable storage media comprising a plurality of instructions stored thereon that, in response to being executed, cause the computing system to:

receive multi-echo functional MRI (ME-fMRI) data obtained from one or more MRI scanners configured to perform at least one magnetic resonance acquisition, the ME-fMRI data including phase information and time information associated with the at least one magnetic resonance acquisition;

measure at least one difference between two or more echoes of a plurality of echoes associated with the at least one magnetic resonance acquisition;

sample distortion across a plurality of image frames included in the ME-fMRI data, the distortion being a result of fluctuating magnetic field inhomogeneities associated with the two or more echoes;

estimate, based on the sampled distortion, a frame-by-frame magnetic field inhomogeneity for each of the plurality of image frames;

based on each estimated frame-by-frame magnetic field inhomogeneity, perform dynamic frame-wise distortion correction for each of the plurality of image frames to generate corrected data; and generate a respective field map for each image frame of the plurality of image frames based on the corrected data, wherein each respective field map is based on a respective field map time series corresponding to a respective ME-fMRI time series for the plurality of image frames.

17. One or more non-transitory computer-readable storage media in accordance with claim 16, wherein the at least one difference is a phase difference between the two or more echoes.

18. One or more non-transitory computer-readable storage media in accordance with claim 16, wherein the plurality of instructions, in response to being executed, further cause the computing system to generate each respective field map based on a displacement field conversion for the corresponding field map time series.

19. One or more non-transitory computer-readable storage media in accordance with claim 16, wherein the dynamic frame-wise distortion correction is configured to correct anatomical alignment inaccuracies in each of the plurality of image frames.

20. One or more non-transitory computer-readable storage media in accordance with claim 16, wherein the estimation of the frame-by-frame magnetic field homogeneity includes the plurality of instructions, in response to being executed, causing the computing system to estimate the frame-by-frame magnetic field inhomogeneity as a slope of a linear relationship between at least one phase and at least one echo time of the two or more echoes.

* * * * *